US 11,448,925 B2

(12) United States Patent
Fujikawa

(10) Patent No.: US 11,448,925 B2
(45) Date of Patent: Sep. 20, 2022

(54) ELECTRO-OPTICAL DEVICE AND ELECTRONIC APPARATUS

(71) Applicant: SEIKO EPSON CORPORATION, Tokyo (JP)

(72) Inventor: Shinsuke Fujikawa, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 358 days.

(21) Appl. No.: 16/724,481

(22) Filed: Dec. 23, 2019

(65) Prior Publication Data
US 2020/0203281 A1    Jun. 25, 2020

(30) Foreign Application Priority Data

Dec. 25, 2018  (JP) .............................. JP2018-240841

(51) Int. Cl.
| | | |
|---|---|---|
| G02F 1/1345 | (2006.01) | |
| G02F 1/1333 | (2006.01) | |
| H01L 23/538 | (2006.01) | |
| H01L 23/367 | (2006.01) | |
| H01L 23/495 | (2006.01) | |
| H01L 23/00 | (2006.01) | |

(52) U.S. Cl.
CPC ...... *G02F 1/13452* (2013.01); *G02F 1/13454* (2013.01); *G02F 1/13458* (2013.01); *G02F 1/133308* (2013.01); *H01L 23/3672* (2013.01); *H01L 23/49524* (2013.01); *H01L 23/5387* (2013.01); *H01L 24/01* (2013.01); *H01L 2924/14* (2013.01)

(58) Field of Classification Search
CPC ............. G02F 1/13458; G02F 1/13452; G02F 1/13454; G02F 1/133308
See application file for complete search history.

(56) References Cited

U.S. PATENT DOCUMENTS

| | | | |
|---|---|---|---|
| 11,137,647 B2 * | 10/2021 | Fujikawa | ............ G02F 1/13452 |
| 2001/0022568 A1 | 9/2001 | Kang | |
| 2011/0175800 A1 | 7/2011 | Mizumaki | |
| 2017/0184903 A1 | 6/2017 | Fujikawa | |
| 2018/0226326 A1 | 8/2018 | Uchiyama | |
| 2018/0228018 A1 | 8/2018 | Yoshii | |

(Continued)

FOREIGN PATENT DOCUMENTS

| | | |
|---|---|---|
| JP | H02-048638 A | 2/1990 |
| JP | 2001-311962 A | 11/2001 |
| JP | 2004-184839 A | 7/2004 |

(Continued)

*Primary Examiner* — Dung T Nguyen
(74) *Attorney, Agent, or Firm* — Oliff PLC

(57) ABSTRACT

An electro-optical device includes a first FPC substrate and a second FPC substrate that overlap each other and are mounted on a terminal portion. A monitor pad electrically coupled to an output terminal of a second driving IC is provided at a substrate surface of the second FPC substrate of a substrate surface of the first FPC substrate and a substrate surface of the second FPC substrate that face each other. An opening extending through the first FPC substrate is provided in a position overlapping the monitor pad. A monitor pad electrically coupled to an output terminal of a first driving IC is provided between an opening of the first FPC substrate and the first driving IC.

15 Claims, 23 Drawing Sheets

(56) References Cited

U.S. PATENT DOCUMENTS

2019/0245283 A1* 8/2019 Oh ..................... G02F 1/13458

FOREIGN PATENT DOCUMENTS

| | | |
|---|---|---|
| JP | 2004-259750 A | 9/2004 |
| JP | 2010-102219 A | 5/2010 |
| JP | 2017-120299 A | 7/2017 |
| JP | 2017-143128 A | 8/2017 |
| JP | 2018-128488 A | 8/2018 |
| JP | 2018-128498 A | 8/2018 |
| WO | 2010/016312 A1 | 2/2010 |

* cited by examiner

ELECTRO-OPTICAL DEVICE AND ELECTRONIC APPARATUS

The present application is based on, and claims priority from JP Application Serial Number 2018-240841, filed Dec. 25, 2018, the disclosure of which is hereby incorporated by reference herein in its entirety.

BACKGROUND

1. Technical Field

The present disclosure relates to an electro-optical device and an electronic apparatus including the electro-optical device.

2. Related Art

As an electro-optical device, for example, an active drive-type liquid crystal device including a transistor as a switching element for each pixel, an organic electroluminescent device, and the like are known. In such an electro-optical device, a mounting aspect is adopted where a flexible wiring substrate at which a drive integrated circuit (IC) is mounted is coupled, via an anisotropic conductive film (ACF) and the like, to a terminal portion of an electro-optical panel including a display region in which a plurality of pixels are disposed.

On the other hand, when the size of the pixels is reduced and the number of pixels increases in order to achieve a high resolution of the electro-optical panel, the above-described mounting aspect is also required to be devised. For example, JP-A-2010-102219 and JP-A-2018-128498 disclose an electro-optical device including a first terminal group and a second terminal group arranged along one side of an electro-optical panel and also arranged in parallel with each other, a first flexible wiring substrate coupled to the first terminal group, and a second flexible wiring substrate coupled to the second terminal group. A driving IC is mounted on each of the first flexible wiring substrate and the second flexible wiring substrate. In other words, the mounting aspect is provided in which the second flexible wiring substrate overlaps the first flexible wiring substrate in plan view.

In the electro-optical panel to which the flexible wiring substrate at which the driving IC is mounted is coupled, whether display is correctly performed by inputting a testing video signal. When a failure occurs in the display, the failure is checked whether the failure is a problem with the electro-optical panel, a problem with the flexible wiring substrate, or a problem with the driving IC mounted on the flexible wiring substrate. Specifically, a state of an output signal is checked by coupling to wiring of the flexible wiring substrate coupled to the output terminal of the driving IC.

In the mounting aspect in which the two flexible wiring substrates overlap each other and are mounted on a terminal portion of the electro-optical panel as described in JP-A-2010-102219 and JP-A-2018-128498, when wiring coupled to one of the driving ICs is present inside the two flexible wiring substrates facing each other, there is a problem in that it is difficult to monitor a signal output from the wiring.

SUMMARY

An electro-optical device according to the present application includes an electro-optical panel including a first terminal group and a second terminal group for external coupling that are provided in order from an end portion of the electro-optical panel to a first direction at an interval; a first flexible wiring substrate electrically coupled to the first terminal group, and at which a first driving IC is mounted; and a second flexible wiring substrate that overlaps the first flexible wiring substrate, and is electrically coupled to the second terminal group, and at which a second driving IC is mounted, wherein one of the first flexible wiring substrate or the second flexible wiring substrate includes a monitor pad electrically coupled to at least one of a plurality of output terminals of the first driving IC or the second driving IC, and the other of the first flexible wiring substrate or the second flexible wiring substrate includes an opening provided in a position overlapping the monitor pad.

Another electro-optical device according to the present application includes an electro-optical panel including a first terminal group and a second terminal group for external coupling that are provided in order from an end portion of the electro-optical panel to a first direction at an interval; a first flexible wiring substrate electrically coupled to the first terminal group, and at which a first driving IC is mounted; and a second flexible wiring substrate that overlaps the first flexible wiring substrate, and is electrically coupled to the second terminal group, and at which a second driving IC is mounted, wherein the second flexible wiring substrate includes a second monitor pad electrically coupled to at least one of a plurality of output terminals of the second driving IC, and wherein the first flexible wiring substrate includes a first opening provided in a position overlapping the second monitor pad, and a first monitor pad electrically coupled to at least one of a plurality of output terminals of the first driving IC is provided between the first opening of the first flexible wiring substrate and the first driving IC.

In the electro-optical device described above, a second opening extending through the second flexible wiring substrate may be provided between an end portion on the second terminal group side of the second flexible wiring substrate and the second monitor pad, a distance in the first direction between an end portion on the second terminal group side of the second flexible wiring substrate and the center of the second opening may be identical to a distance in the first direction between an end portion on the first terminal group side of the first flexible wiring substrate and the center of the first opening, and a distance in the first direction between the center of the second opening and the center of the second monitor pad may be identical to a distance in the first direction between the center of the first opening and the center of the first monitor pad.

In the electro-optical device described above, the first opening may have a length in the first direction longer than a length in a second direction that intersects the first direction.

In the electro-optical device described above, a size of the first opening may be greater than a size of the second monitor pad.

In the electro-optical device described above, a size of the first opening may be smaller than a size of the second monitor pad.

In the electro-optical device described above, a plurality of the second monitor pads may be provided at the second flexible wiring substrate.

In the electro-optical device described above, at the second flexible wiring substrate, the plurality of second monitor pads may be disposed adjacent to each other in the first direction.

In the electro-optical device described above, at the second flexible wiring substrate, the plurality of second monitor pads may be provided at a predetermined distance in a second direction that intersects the first direction, and the first opening may include two first openings provided at the predetermined distance in the second direction.

In the electro-optical apparatus described above, a letter or a sign for identifying a signal output from an output terminal of the second driving IC to which the second monitor pad is electrically coupled may be indicated near the first opening.

Further, an electro-optical device according to the present application includes an electro-optical panel including a first terminal group and a second terminal group for external coupling that are provided in order from an end portion of the electro-optical panel to a first direction at an interval; a first flexible wiring substrate electrically coupled to the first terminal group, and at which a first driving IC is mounted; and a second flexible wiring substrate that overlaps the first flexible wiring substrate, and is electrically coupled to the second terminal group, and at which a second driving IC is mounted, wherein one of the first flexible wiring substrate or the second flexible wiring substrate includes a monitor pad electrically coupled to at least one of a plurality of output terminals of the first driving IC or the second driving IC, and the other of the first flexible wiring substrate or the second flexible wiring substrate includes a notch portion is provided in a position overlapping the monitor pad.

Further, another electro-optical device according to the present application includes an electro-optical panel including a first terminal group and a second terminal group for external coupling that are provided in order from an end portion of the electro-optical panel to a first direction at an interval; a first flexible wiring substrate electrically coupled to the first terminal group, and at which a first driving IC is mounted; and a second flexible wiring substrate that overlaps the first flexible wiring substrate, and is electrically coupled to the second terminal group, and at which a second driving IC is mounted, wherein the second flexible wiring substrate includes a second monitor pad electrically coupled to at least one of a plurality of output terminals of the second driving IC, and wherein the first flexible wiring substrate includes a first notch portion provided in a position overlapping the second monitor pad, and a first monitor pad electrically coupled to at least one of a plurality of output terminals of the first driving IC is provided between the first notch portion of the first flexible wiring substrate and the first driving IC.

In the electro-optical device described above, a second notch portion acquired by cutting a side portion of the second flexible wiring substrate may be provided between an end portion on the second terminal group side of the second flexible wiring substrate and the second monitor pad, a distance in the first direction between an end portion on the second terminal group side of the second flexible wiring substrate and an end portion of the second notch portion may be identical to a distance in the first direction between an end portion on the first terminal group side of the first flexible wiring substrate and an end portion of the first notch portion, and a shape of the first notch portion may be identical to a shape of the second notch portion.

In the electro-optical device described above, a letter or a sign for identifying a signal output from an output terminal of the second driving IC to which the second monitor pad is electrically coupled may be indicated near the first notch portion.

An electronic apparatus according to the present disclosure includes the electro-optical device described above.

DESCRIPTION OF EXEMPLARY
EMBODIMENTS

Exemplary embodiments of the present disclosure will be described below with reference to the accompanying drawings. Note that, in the following drawings, parts described are illustrated in an enlarged or reduced state as appropriate to the extent that the parts can be recognized.

1. First Embodiment 1-1. Electro-Optical Device

An electro-optical device according to the present embodiment will be described by exemplifying an active drive-type liquid crystal device. The liquid crystal device is a micro display used as a light modulation means of a projection-type display apparatus described below.

Figure 1:
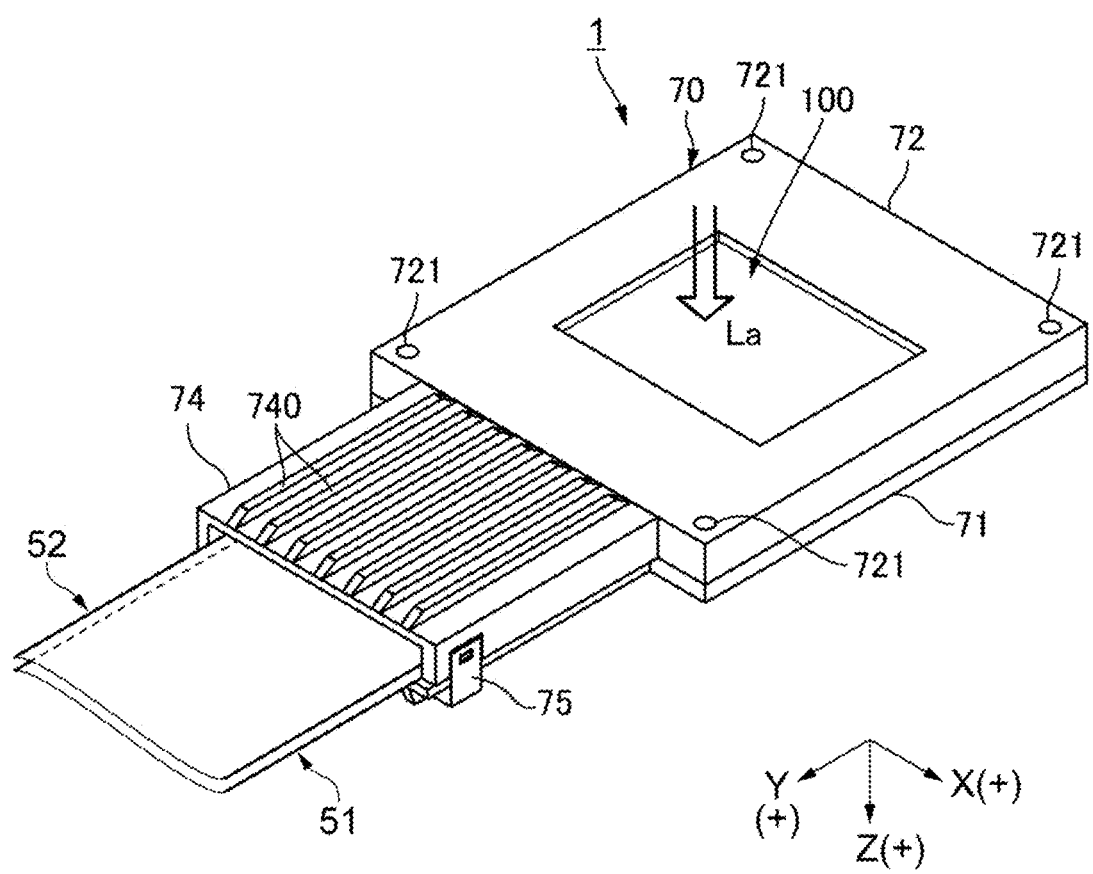
FIG. 1 is a perspective view illustrating a liquid crystal device as an electro-optical device according to a first embodiment.
Figure 2:
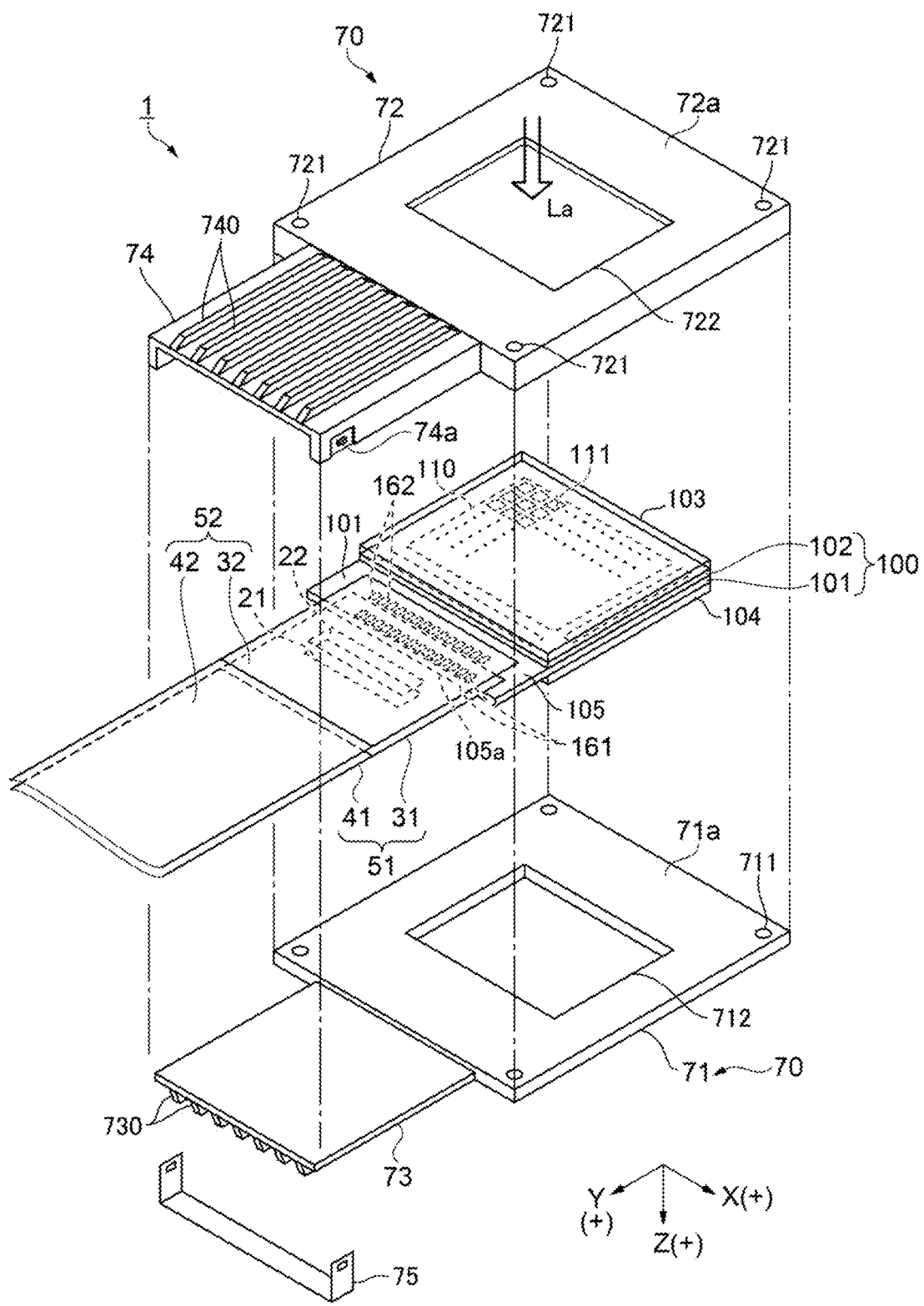
FIG. 2 is an exploded perspective view illustrating a configuration of the liquid crystal device as the electro-optical device according to the first embodiment.

FIG. 1 is a perspective view illustrating a liquid crystal device as an electro-optical device according to a first embodiment. FIG. 2 is an exploded perspective view illustrating a configuration of the liquid crystal device as the electro-optical device according to the first embodiment.

As illustrated in FIG. 1, a liquid crystal device 1 as the electro-optical device according to the present embodiment includes a liquid crystal panel 100 as an electro-optical panel, a first mounting substrate 51 and a second mounting substrate 52 electrically coupled to the liquid crystal panel 100, and a frame-shaped holder 70 that sandwiches and holds the liquid crystal panel 100. The holder 70 is constituted of a first holder member 71 and a second holder member 72 formed by using, for example, a metal such as aluminum or an alloy.

Hereinafter, description is given while one direction along one side portion of the liquid crystal panel 100 is referred to as an X direction, one direction along another one side portion that intersects the one side portion is referred to as a Y direction, and a traveling direction of light La incident on the liquid crystal panel 100 is referred to as a Z direction. The X direction and the Y direction are orthogonal to each other. The Z direction is orthogonal to the X direction and the Y direction. Additionally, a view taken along the Z direction will be called a "plan view". The −Y direction opposite to the +Y direction corresponds to a first direction of the present disclosure, and the +X direction or the −X direction corresponds to a second direction of the present disclosure.

The first mounting substrate 51 and the second mounting substrate 52 electrically coupled to the liquid crystal panel 100 protrude from the holder 70 in the +Y direction and are electrically coupled to an external circuit (not illustrated). Details of the first mounting substrate 51 and the second mounting substrate 52 will be described later.

As illustrated in FIG. 2, the liquid crystal panel 100 according to the present embodiment is transparent, and includes an element substrate 101 and a counter substrate 102 that are constituted by using a light-transmitting substrate such as a quartz substrate, for example, and are disposed so as to face each other, and a liquid crystal layer sandwiched between the pair of substrates. The counter substrate 102 is disposed on an incident side of the light La with respect to the element substrate 101. The liquid crystal panel 100 includes a plurality of pixels 111 arranged in matrix in the +X direction and the +Y direction. A region in which the plurality of pixels 111 are arranged in matrix is a display region 110. Note that the display region 110 may include a plurality of dummy pixels that do not contribute to display.

A first dust-resistant substrate 103 is disposed on the incident side of the light La of the counter substrate 102, and a second dust-resistant substrate 104 is disposed on a side at which the incident light La is modulated and emitted as display light from the element substrate 101. The first dust-resistant substrate 103 and the second dust-resistant substrate 104 are provided so as to reduce an effect of an attached foreign material when the display of the liquid crystal panel 100 is expanded and projected. A light-transmitting substrate such as a quartz substrate, for example, that is the same as that of the element substrate 101 and the counter substrate 102 is used for the first dust-resistant substrate 103 and the second dust-resistant substrate 104 in consideration of dimensional change due to thermal expansion and contraction.

A portion of the element substrate 101 protruding in the +Y direction from the counter substrate 102 of the liquid crystal panel 100 is a terminal portion 105. A first terminal group 161 and a second terminal group 162 for external coupling are provided, at an interval, in the −Y direction in order from an end portion 105a of the terminal portion 105. The first terminal group 161 and the second terminal group 162 each include a plurality of terminals arranged at a predetermined pitch in the +X direction.

The first mounting substrate 51 includes a first flexible wiring substrate 31 at which a first driving IC 21 is mounted, and a first extending substrate 41 electrically coupled to the first flexible wiring substrate 31. Similarly, the second mounting substrate 52 includes a second flexible wiring substrate 32 at which a second driving IC 22 is mounted, and a second extending substrate 42 electrically coupled to the second flexible wiring substrate 32.

The first flexible wiring substrate 31 is electrically coupled to the first terminal group 161 provided at the terminal portion 105 of the liquid crystal panel 100. Similarly, the second flexible wiring substrate 32 is electrically coupled to the second terminal group 162 provided at the terminal portion 105 of the liquid crystal panel 100. In other words, the first flexible wiring substrate 31 and the second flexible wiring substrate 32 overlap each other in the Z direction and are mounted on the terminal portion 105 of the liquid crystal panel 100. The first driving IC 21 is mounted on the first flexible wiring substrate 31 electrically coupled to the first terminal group 161. Similarly, the second driving IC 22 is mounted on the second flexible wiring substrate 32 electrically coupled to the second terminal group 162.

The first holder member 71 that constitutes the holder 70 includes a quadrangular main body 71a and a plate-like first heat dissipation portion 73 protruding in the +Y direction from the main body 71a. A plurality of heat dissipating fins 730 that extend along the +Y direction and are also arranged at a predetermined interval in the +X direction are provided in the +Z direction of the first heat dissipation portion 73. The main body 71a is provided with a quadrangular opening 712 in a portion corresponding to the display region 110 of the liquid crystal panel 100. A hole 711 is provided in each of four corners of the main body 71a.

The other second holder member 72 that constitutes the holder 70 includes a quadrangular main body 72a and a gate-like second heat dissipation portion 74 protruding in the +Y direction from the main body 72a. A plurality of heat dissipating fins 740 that extend along the +Y direction and are also arranged at a predetermined interval in the +X direction are provided in the −Z direction of the second heat dissipation portion 74. The main body 72a is provided with a quadrangular opening 722 in a portion corresponding to the display region 110 of the liquid crystal panel 100. A hole 721 is provided in each of four corners of the main body 72a. The + side of the second holder member 72 in the Z direction has a recessed portion being recessed.

In other words, the liquid crystal panel 100 to which the first dust-resistant substrate 103 and the second dust-resistant substrate 104 are bonded is housed in the recessed portion of the second holder member 72 and is sandwiched so as to be covered with the first holder member 71. The main body 71a of the first holder member 71 and the main body 72a of the second holder member 72 are screwed by inserting, for example, bolts into the holes 711 and 721 provided in the four corners. Additionally, in a state where the first mounting substrate 51 and the second mounting substrate 52 are sandwiched between the first heat dissipation portion 73 and the second heat dissipation portion 74, the first heat dissipation portion 73 is fixed to the second heat dissipation portion 74 by a fixing member 75. A locking portion 74a to which the fixing member 75 is detachably locked is provided at the side surface on the + side and the side surface on the − side in the X direction of the second heat dissipation portion 74.

Note that, in the present embodiment, the liquid crystal device 1 including the holder 70 is an example of the electro-optical device, but the holder 70 is not an essential configuration in the electro-optical device.

Figure 3:
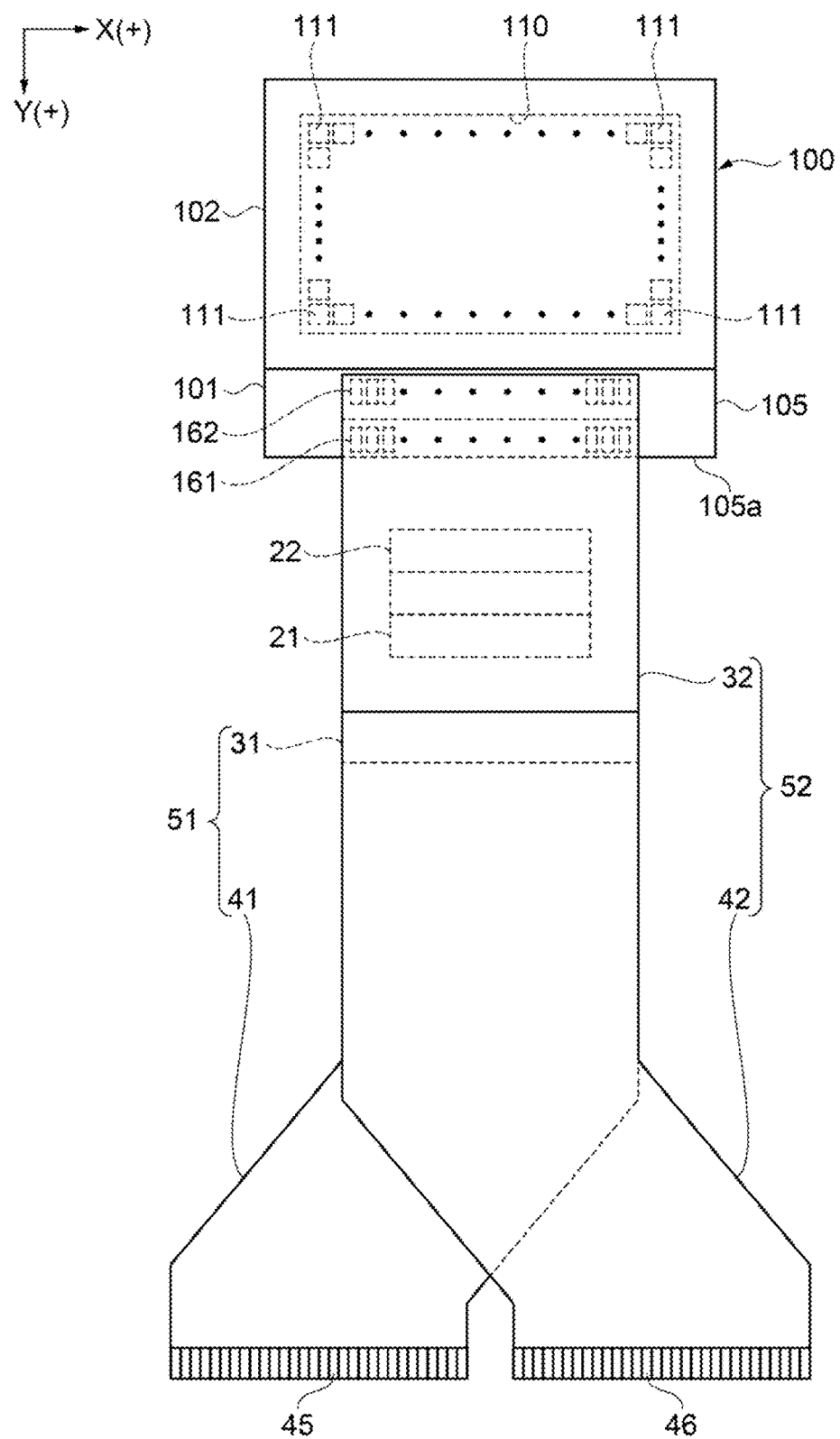
FIG. 3 is a plan view illustrating a liquid crystal panel electrically coupled to a first mounting substrate and a second mounting substrate according to the first embodiment.
Figure 4:
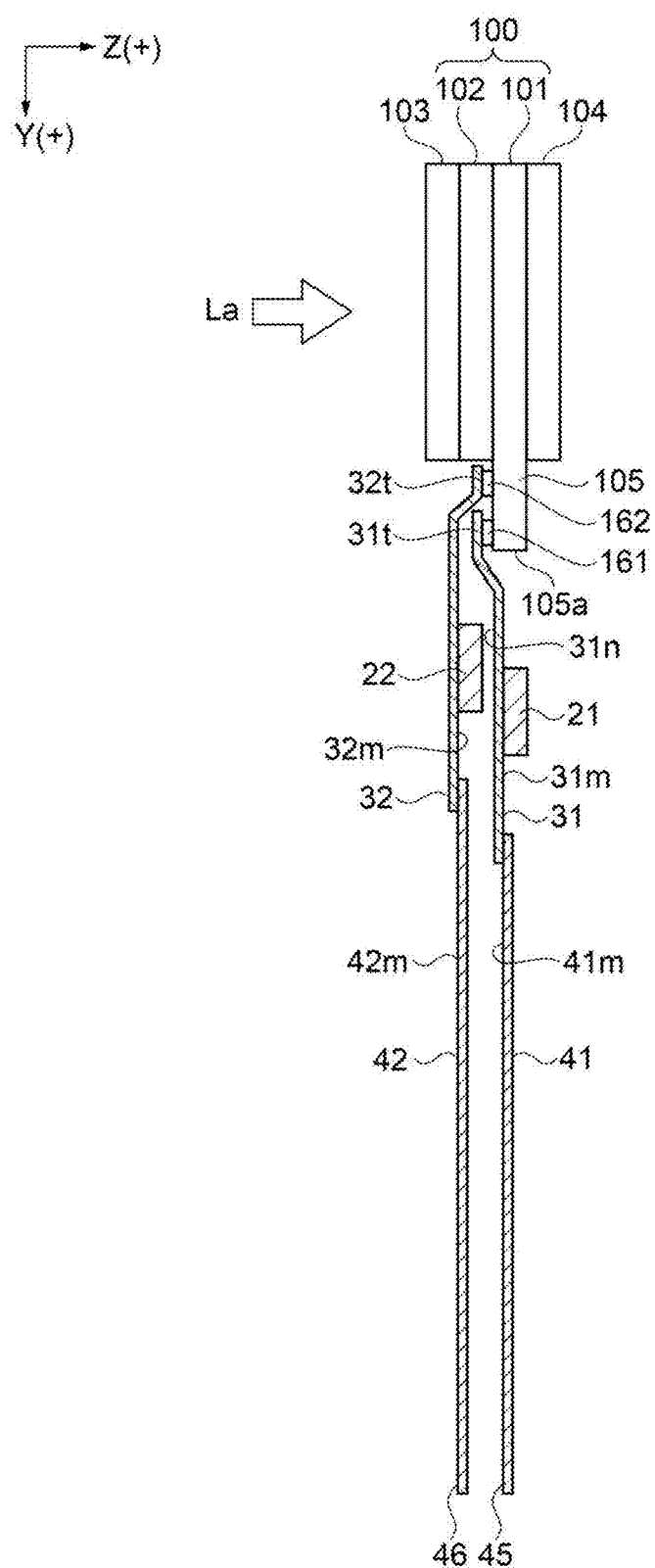
FIG. 4 is a side view illustrating the liquid crystal panel electrically coupled to the first mounting substrate and the second mounting substrate.

FIG. 3 is a plan view illustrating the liquid crystal panel electrically coupled to the first mounting substrate and the second mounting substrate according to the first embodiment. FIG. 4 is a side view illustrating the liquid crystal panel electrically coupled to the first mounting substrate and the second mounting substrate. As illustrated in FIG. 3, the liquid crystal panel 100 includes the plurality of pixels 111 arranged in matrix in the +X direction that is a row direction and the +Y direction that is a column direction in the display region 110. The liquid crystal panel 100 is an active drive type, and the pixel 111 is provided with a pixel electrode (not illustrated), a switching element (not illustrated) that performs switching control on the pixel electrode, a counter electrode (not illustrated) facing the pixel electrode with the liquid crystal layer interposed therebetween, and a retention capacitor. The pixel electrode, the switching element, and the retention capacitor are formed on the element substrate 101. The switching element is, for example, a thin film transistors (TFT). The counter electrode is formed on the counter substrate 102 across at least the display region 110 so as to face the plurality of pixel electrodes. The pixel electrode and the counter electrode are formed by using a transparent conductive film such as ITO and IZO, for example.

The first terminal group 161 and the second terminal group 162 are provided on the terminal portion 105 of the element substrate 101. The first flexible wiring substrate 31 of the first mounting substrate 51 is electrically coupled to the first terminal group 161. The second flexible wiring substrate 32 of the second mounting substrate 52 is electrically coupled to the second terminal group 162. The first extending substrate 41 electrically coupled to the first flexible wiring substrate 31 has an end portion in the +Y direction bent in the −X direction. In contrast, the second extending substrate 42 electrically coupled to the second flexible wiring substrate 32 has an end portion in the +Y direction bent in the +X direction. A first input terminal 45 is provided at the end portion in the +Y direction of the first extending substrate 41. A second input terminal 46 is provided at the end portion in the +Y direction of the second extending substrate 42. In plan view, the first input terminal 45 and the second input terminal 46 are aligned linearly in the +X direction. According to such first mounting substrate 51 and second mounting substrate 52, the first input terminal 45 of the first extending substrate 41 can be coupled to one connector of two connectors placed on an external circuit substrate, and the second input terminal 46 of the second extending substrate 42 can be coupled to the other connector. In other words, when the first extending substrate 41 is coupled to the one connector, the second extending substrate 42 is configured so as not to become an obstacle. Note that the shape of the first extending substrate 41 and the second extending substrate 42 is not limited to a bent state, but may be a straight shape.

As illustrated in FIG. 4, the first driving IC 21 is mounted on one substrate surface 31m of the first flexible wiring substrate 31. A coupling terminal group 31t is provided on an end portion of the one substrate surface 31m of the first flexible wiring substrate 31. The second driving IC 22 is mounted on one substrate surface 32m of the second flexible wiring substrate 32. A coupling terminal group 32t is provided on an end portion of the one substrate surface 32m of the second flexible wiring substrate 32. In other words, in the present embodiment, the first flexible wiring substrate 31 and the second flexible wiring substrate 32 are both flexible single-sided wiring substrates.

The first terminal group 161 and the second terminal group 162 are provided in this order on the terminal portion 105 of the element substrate 101 that overhangs from the counter substrate 102 in the +Y direction, and are provided, at an interval, from the end portion 105a of the terminal portion 105. The first terminal group 161 and the coupling terminal group 31t of the first flexible wiring substrate 31 are electrically coupled via, for example, an ACF. Similarly, the second terminal group 162 and the coupling terminal group 32t of the second flexible wiring substrate 32 are electrically coupled via, for example, an ACF.

The second flexible wiring substrate 32 is mounted on the terminal portion 105 of the element substrate 101 so as to overlap the first flexible wiring substrate 31 mounted first in the +Z direction. Further, the second flexible wiring substrate 32 is mounted on the terminal portion 105 offset in the −Y direction with respect to the first flexible wiring substrate 31 in correspondence with the arrangement of the first terminal group 161 and the second terminal group 162 on the terminal portion 105. Therefore, when the first flexible wiring substrate 31 and the second flexible wiring substrate 32 are mounted on the terminal portion 105 of the element substrate 101, the other substrate surface 31n of the first flexible wiring substrate and the one substrate surface 32m of the second flexible wiring substrate 32 face each other in the Z direction.

The first extending substrate 41 and the second extending substrate 42 are also flexible single-sided wiring substrates. The first input terminal 45 is provided at an end portion in the +Y direction of one substrate surface 41m of the first extending substrate 41, and a coupling terminal (not illustrated) is provided at an end portion in the −Y direction. Similarly, the second input terminal 46 is provided at an end portion in the +Y direction of one substrate surface 42m of the second extending substrate 42, and a coupling terminal (not illustrated) is provided at an end portion in the −Y direction. The first extending substrate 41 is electrically coupled to the first flexible wiring substrate 31 via the coupling terminal provided at the end portion in the −Y direction. The second extending substrate 42 is electrically coupled to the second flexible wiring substrate 32 via the coupling terminal provided at the end portion in the −Y direction.

Although not illustrated in FIG. 4, a plurality of wiring lines and, for example, a resist layer or a cover lay that covers the plurality of wiring lines are provided at the one substrate surface 31m of the first flexible wiring substrate 31. Similarly, a plurality of wiring lines and, for example, a resist layer or a cover lay that covers the plurality of wiring lines are provided at the one substrate surface 32m of the second flexible wiring substrate 32. A plurality of wiring lines and, for example, a resist layer or a cover lay that covers the plurality of wiring are also provided at each of the first extending substrate 41 and the second extending substrate 42.

Further, although not illustrated in FIG. 4, the first driving IC 21 is a bare chip, and is mounted on the first flexible wiring substrate 31 while an outer periphery is molded. The second driving IC 22 is also a bare chip, and is mounted on the second flexible wiring substrate 32 while an outer periphery is molded. Furthermore, in order to secure, on the terminal portion 105, coupling reliability between the first terminal group 161 and the coupling terminal group 31t and coupling reliability between the second terminal group 162 and the coupling terminal group 32t, a portion of the terminal portion 105 at which the first flexible wiring substrate 31 and the second flexible wiring substrate 32 are mounted is preferably sealed (molded) by using a mold material having insulating properties. Note that, in addition to the first driving IC 21, an electronic component such as a chip resistor and a chip capacitor, for example, may be mounted on the first flexible wiring substrate 31. Similarly, an electronic component in addition to the second driving IC 22 may also be mounted on the second flexible wiring substrate 32.

1-2. Electrical Configuration of Liquid Crystal Device

Figure 5:
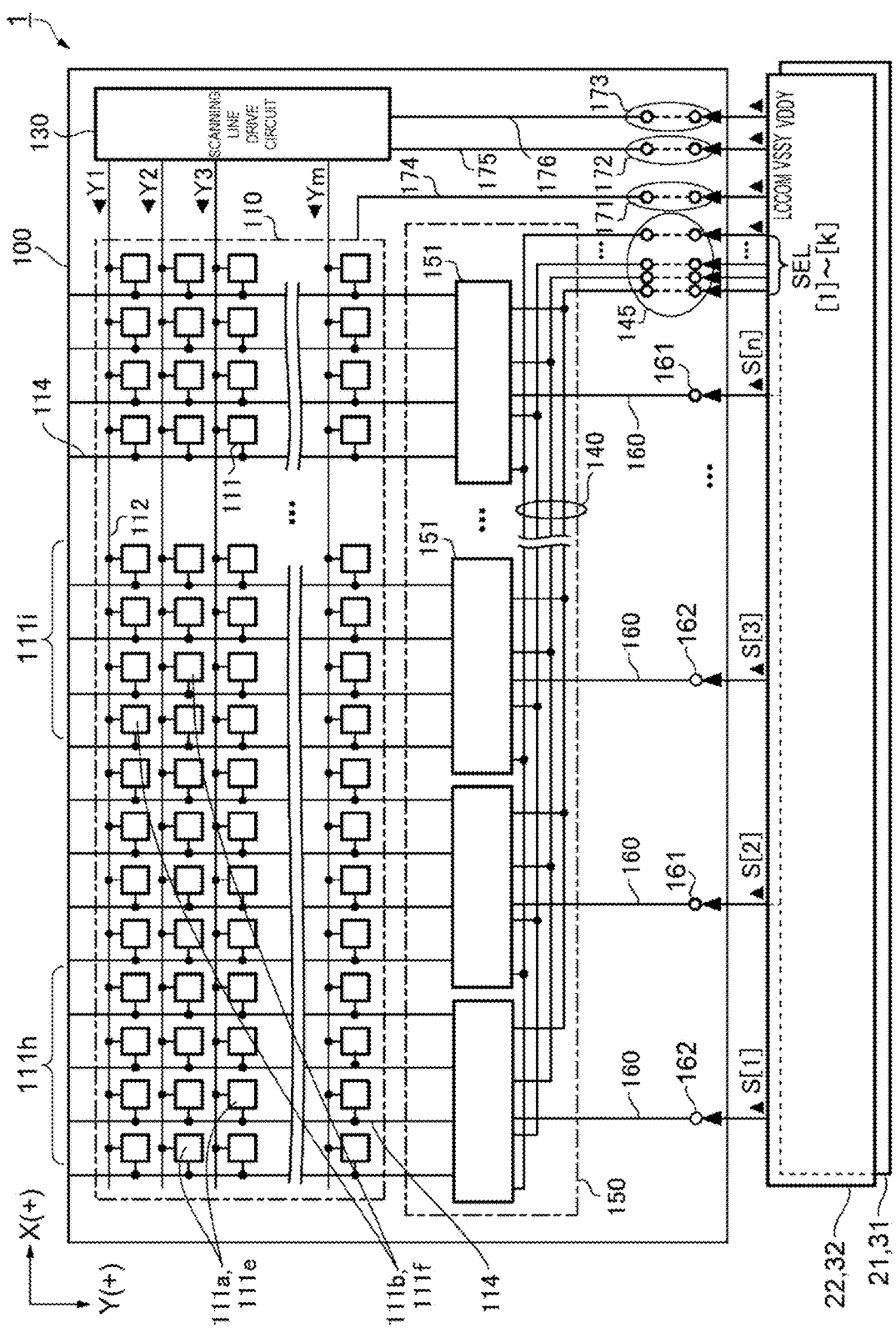
FIG. 5 is a circuit diagram illustrating an electrical configuration of the liquid crystal device as the electro-optical device according to the first embodiment.

FIG. 5 is a circuit diagram illustrating an electrical configuration of the liquid crystal device as the electro-optical device.

As illustrated in FIG. 5, the liquid crystal panel 100 of the liquid crystal device 1 as the electro-optical device according to the present embodiment includes the display region 110, a scanning line drive circuit 130, a data line selection circuit 150 (selection circuit), n image signal lines 160, n image signal input terminals (the first terminal group 161 and the second terminal group 162), k selection signal lines 140, k selection signal input terminals 145, a plurality of power supply terminals 171, 172, and 173, and power supply lines 174, 175, and 176 corresponding to the power supply terminals 171, 172, and 173. n is an integer equal to or greater than 1, and k is an integer equal to or greater than 2. In the present embodiment, k=4 as illustrated in FIG. 5, which is not limited thereto. These elements are formed on the element substrate 101 illustrated in FIG. 2. In the element substrate 101, the data line selection circuit 150 is formed along the +X direction between the display region 110, and the first terminal group 161 and the second terminal group 162, and the scanning line drive circuit 130 is formed along the +Y direction between the other side intersecting the one side portion at which the data line selection circuit 150 is formed and the display region 110.

The first driving IC 21 mounted on the first flexible wiring substrate 31 and the second driving IC 22 mounted on the second flexible wiring substrate 32 output an image signal, a control signal, and the like indicating an image to be displayed on the liquid crystal panel 100 according to a clock signal, a control signal, and image data input from an external upper circuit (not illustrated) via the first extending substrate 41 and the second extending substrate 42 (see FIG. 4). The liquid crystal panel 100 displays an image based on the clock signal and the image signal input from the first driving IC 21 and the second driving IC 22. The first driving IC 21 and the second driving IC 22 have the same configuration and output the same signal other than the image signal.

m scanning lines 112, (k×n) the data lines 114, and (m×k×n) pixels 111 are provided in the display region 110. m is an integer equal to or greater than 1. The pixels 111 are provided corresponding to intersections of the scanning lines 112 and the data lines 114, and are arranged in matrix in m rows×(k×n) columns. The scanning lines 112 are signal lines that transmit scanning signals Y1, Y2, Y3, . . . and Ym, and are provided along the X direction that is the row direction from the scanning line drive circuit 130. The data lines 114 are signal lines that transmit data signals, and are provided along the Y direction that is the column direction from the data line selection circuit 150.

In the display region 110, k×m pixels 111 corresponding to k (column) of the data lines 114 form one pixel group (block). For example, a first pixel group 111h in which a plurality (k) of first pixel columns 111e in which a plurality (m) of first pixels 111a are arranged along the Y direction are arranged along the X direction, and a second pixel group 111i in which a plurality (k) of second pixel columns 111f in which a plurality (m) of second pixels 111b are arranged along the Y direction are arranged along the X direction are provided. Here, the pixels 111 belonging to the same pixel group are coupled to the same image signal line 160 via the data line selection circuit 150. Therefore, the liquid crystal panel 100 includes n (column) of pixel groups divided into n blocks by n (columns) of the image signal lines 160 or n image signal input terminals (the first terminal group 161 and the second terminal group 162).

The scanning line drive circuit 130 selects a row to which data is written from among the plurality of pixels 111 arranged in matrix. Specifically, the scanning line drive circuit 130 outputs a scanning signal for selecting one scanning line 112 from among the plurality of scanning lines 112. The scanning line drive circuit 130 supplies the scanning signals Y1, Y2, Y3, . . . and Ym to the scanning lines 112 in a first row, a second row, a third row, . . . and an m-th row. The scanning signals Y1, Y2, Y3, . . . and Ym are, for example, signals that are sequentially exclusively at a high level.

The data line selection circuit 150 selects a column (pixel column) of the pixels 111 to which an image signal is written in each pixel group. Specifically, the data line selection circuit 150 selects at least one data line 114 from among the k data lines 114 belonging to the pixel group in accordance with selection signals SEL [1] to SEL [k]. Each of the data lines 114 in k units is coupled to one image signal line 160 by the data line selection circuit 150. In the present embodiment, the data line selection circuit 150 includes n demultiplexers 151 corresponding to the respective n pixel groups.

The image signal line 160 couples the image signal input terminals (the first terminal group 161 and the second terminal group 162) to the data line selection circuit 150. The image signal lines 160 are signal lines that transmit, to the data line selection circuit 150, image signals S (S [1] to S [n]) input from the first flexible wiring substrate 31 and the second flexible wiring substrate 32 via the image signal input terminals (first terminal group 161 and second terminal group 162), and are provided in n columns corresponding to the respective n image signal input terminals (the first terminal group 161 and the second terminal group 162) or the respective n pixel groups. The image signal S is a signal indicating data written to the pixel 111. Here, an "image" refers to a still image or a video. One image signal line 160 is coupled to the k data lines 114 via the data line selection circuit 150. Therefore, in the image signal S, the data supplied to the k data lines 114 is time-division multiplexed.

The selection signal line 140 couples the selection signal input terminal 145 to the demultiplexer 151 of the data line selection circuit 150. The selection signal lines 140 (140 [1] to 140 [k]) are signal lines that transmit the selection signals SEL (SEL [1] to SEL [k]) input from the selection signal input terminals 145 (145 [1] to 145 [k]), and k selection signal lines 140 are provided. The selection signal SEL is a signal that is sequentially at the high level.

The image signal input terminals (the first terminal group 161 and the second terminal group 162) are terminals to which the first flexible wiring substrate 31 and the second flexible wiring substrate 32 are coupled, and are supplied with the image signal S [j] (j is an integer satisfying 1≤j≤n). In this example, the image signal S [2t] is supplied from the first driving IC 21 to the image signal input terminal (the first terminal group 161) corresponding to the image signal lines 160 in even columns of a second column, a fourth column, a sixth column, . . . and a (2t)-th column. The image signal S [2t−1] is supplied from the second driving IC 22 to the image signal input terminal (the second terminal group 162) corresponding to the image signal lines 160 in odd columns of a first column, a third column, a fifth column, . . . and a (2t−1)-th column (t is an integer of 1≤t≤n/2). Further, the image signal S is a so-called data signal, and analog signals having different waveforms in accordance with display of an image are supplied to the image signal input terminals (the first terminal group 161 and the second terminal group 162).

The selection signal input terminal 145 is a terminal coupled to the first flexible wiring substrate 31 and the second flexible wiring substrate 32, and is supplied with the selection signal SEL made of a pulse signal. The selection signal SEL is a timing signal for selecting the data line 114 in the data line selection circuit 150. The selection signal input terminal 145 includes a terminal to which the first flexible wiring substrate 31 is coupled and a terminal coupled to the second flexible wiring substrate 32. The selection signal SEL is supplied from both or one of the first driving IC 21 of the first flexible wiring substrate 31 and the second driving IC 22 of the second flexible wiring substrate 32. In the present embodiment, the selection signal SEL having the same waveform is supplied to the selection signal input terminal 145 corresponding to each of the first flexible wiring substrate 31 and the second flexible wiring substrate 32. Therefore, for the selection signal input terminal 145, the terminal to which the first flexible wiring substrate 31 is coupled and the terminal coupled to the second flexible wiring substrate 32 are indicated without distinction. However, a distinction may be made between the first terminal group 161 and the second terminal group 162 as the terminal to which the first flexible wiring substrate 31 is coupled and the terminal coupled to the second flexible wiring substrate 32.

The power supply terminal 171, the power supply terminal 172, and the power supply terminal 173 are terminals coupled to the first flexible wiring substrate 31 and the second flexible wiring substrate 32, and are supplied with a power supply voltage from the upper circuit via the first flexible wiring substrate 31 and the second flexible wiring substrate 32 without passing through the first driving IC 21 and the second driving IC 22. The power supply voltage is a voltage used as a power supply in the liquid crystal panel 100, and is a DC voltage in this example. The power supply terminal 171 is a terminal for supplying a common voltage LCCOM. The power supply terminal 172 is a terminal for supplying a reference voltage VSSY. The power supply terminal 173 is a terminal for supplying a drive voltage VDDY. The common voltage LCCOM is a voltage that serves as a reference potential of a voltage applied to the liquid crystal layer. The reference voltage VSSY is a voltage that becomes a power supply potential on a low-voltage side of the scanning line drive circuit 130. The drive voltage VDDY is a voltage that becomes a power supply potential on a high-voltage side of the scanning line drive circuit 130. For the power supply terminals 171, 172, and 173, the terminal to which the first flexible wiring substrate 31 is coupled and the terminal coupled to the second flexible wiring substrate 32 are indicated without distinction. However, a distinction may be made between the first terminal group 161 and the second terminal group 162 as the terminal to which the first flexible wiring substrate 31 is coupled and the terminal coupled to the second flexible wiring substrate 32.

In the present embodiment, only one scanning line drive circuit 130 is provided in the element substrate 101, and thus the power supply terminals 172 and 173 are provided on only one side in the +X direction. Note that the arrangement of the scanning line drive circuit 130 is not limited to this, and the scanning line drive circuit 130 may be provided on both sides that sandwich the display region 110 in the X direction. In this case, the power supply terminals 171, 172, and 173 are each provided on both sides in the X direction of the element substrate 101.

In the present embodiment, data written to the pixels 111 in [k×j−k+1] to [k×j]-th columns of the corresponding pixel group are time-division multiplexed in the image signal S [j]. Further, when S [j] is an odd-numbered S [2t−1], S [j] is supplied to the data lines 114 of an odd-numbered pixel group from the first driving IC 21. Further, when S [j] is an even-numbered S [2t], S [j] is supplied to the data lines 114 of an even-numbered pixel group from the second driving IC 22. According to such a configuration, the two driving ICs of the first driving IC 21 and the second driving IC 22 are used, and thus data can be written to twofold pixels in one period as compared to a case in which one driving IC is used. Then, as described above, the first terminal group 161 and the second terminal group 162 are disposed, and thus a high-resolution, high-grade, and small liquid crystal device 1 can be achieved. Note that coupling between the first terminal group 161 and the second terminal group 162, and the data lines 114 of the pixel group is not limited to this, and coupling may be made such that the image signal S [j] is supplied from the first driving IC 21 to the data lines 114 of the even-numbered pixel group, and the image signal S [j] is supplied from the second driving IC 22 to the data lines 114 of the odd-numbered pixel group.

The liquid crystal device 1 in such an embodiment may check whether display is normally performed by driving the liquid crystal panel 100 by various signals such as the clock signal, the control signal, and the image data input from the external circuit via the first mounting substrate 51 and the second mounting substrate 52. In a case in which a failure occurs in the display, which of the liquid crystal panel 100, the first mounting substrate 51, and the second mounting substrate 52 causes the cause needs to be checked. Particularly, since the first driving IC 21 is mounted on the first flexible wiring substrate 31 of the first mounting substrate 51, and the second driving IC 22 is mounted on the second flexible wiring substrate 32 of the second mounting substrate 52, it is important to check whether or not a signal output from the first driving IC 21 and the second driving IC 22 is normal.

As illustrated in FIG. 4, each of the first flexible wiring substrate 31 and the second flexible wiring substrate 32 is a single-sided wiring substrate. When the first flexible wiring substrate 31 and the second flexible wiring substrate 32 overlap each other and are mounted on the terminal portion 105 of the element substrate 101, coupling to wiring coupled to a plurality of output terminals of the first driving IC 21 mounted on the first flexible wiring substrate 31 is relatively easy because the wiring is provided at the one substrate surface 31m of the first flexible wiring substrate 31. On the other hand, the second flexible wiring substrate 32 overlaps the first flexible wiring substrate 31 in the Z direction, and thus coupling to wiring coupled to a plurality of output terminals of the second driving IC 22 mounted on the second flexible wiring substrate 32 is difficult because the first flexible wiring substrate 31 is an obstacle. Thus, the inventors devise a configuration of the first flexible wiring substrate 31 and the second flexible wiring substrate 32 that can easily achieve coupling to the wiring coupled to the plurality of output terminals of not only the first driving IC 21 but also the second driving IC 22 even when the first flexible wiring substrate 31 and the second flexible wiring substrate 32 overlap each other and are mounted on the terminal portion 105 of the element substrate 101. Specific description is given below with reference to the drawings by exemplifying Working Examples.

1-3. Working Example of First Flexible Wiring Substrate and Second Flexible Wiring Substrate in First Embodiment 1-3-1. Working Example 1

Figure 6:
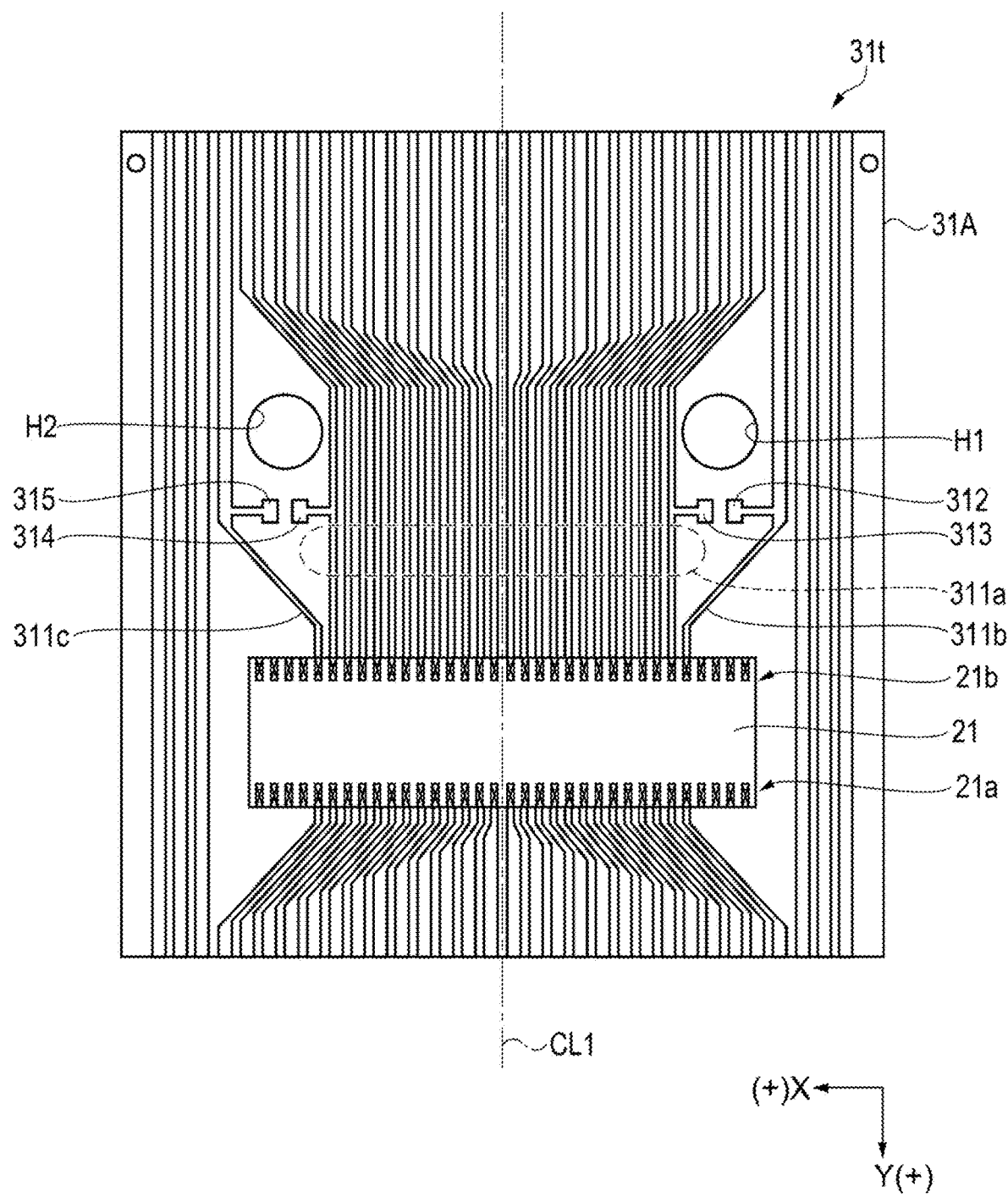
FIG. 6 is a plan view illustrating a configuration of a first flexible wiring substrate according to Working Example 1.
Figure 7:
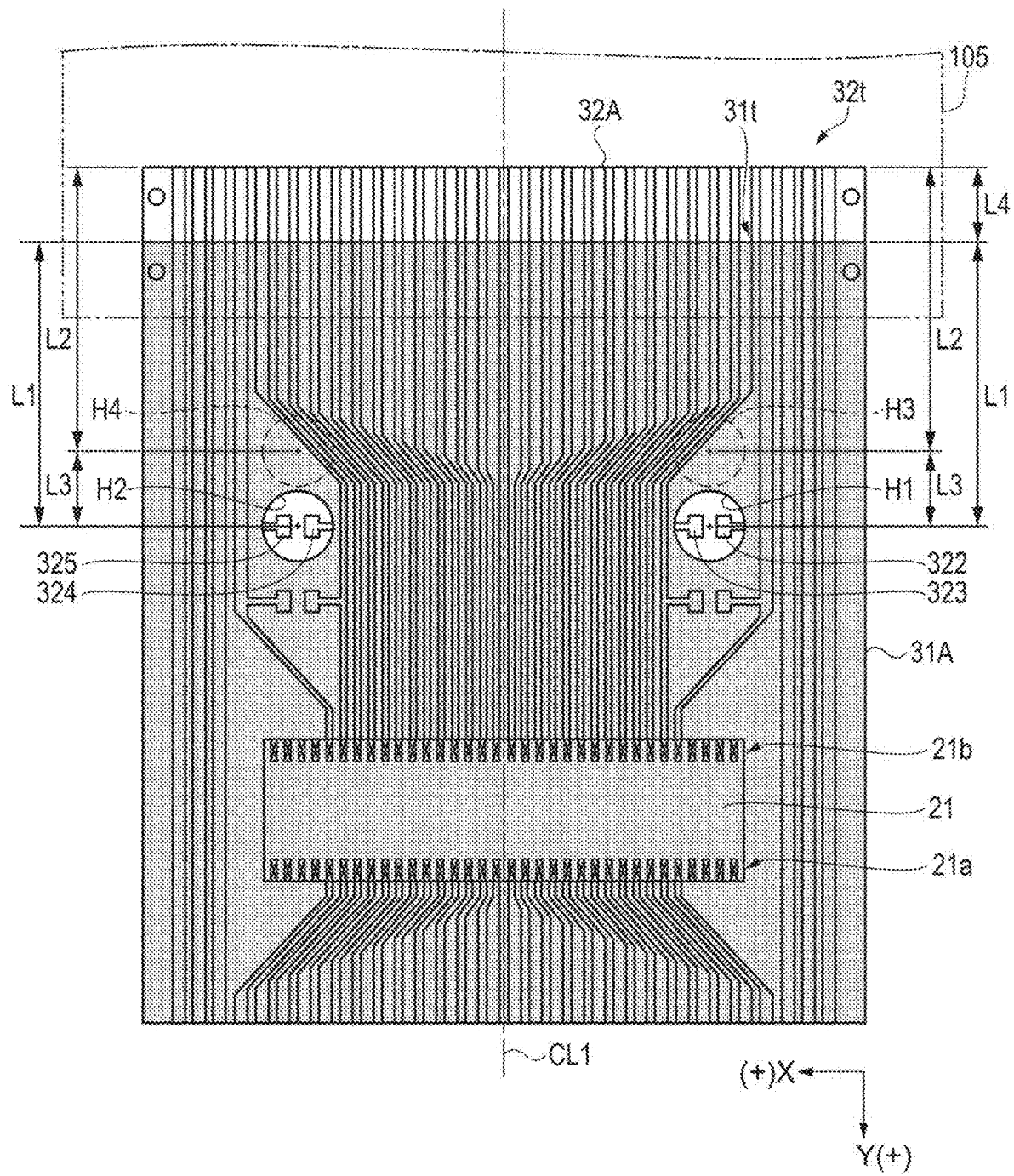
FIG. 7 is a plan view illustrating a state where the first flexible wiring substrate and a second flexible wiring substrate according to Working Example 1 are mounted on the terminal portion.

FIG. 6 is a plan view illustrating a configuration of a first flexible wiring substrate according to Working Example 1. FIG. 7 is a plan view illustrating a state where the first flexible wiring substrate and a second flexible wiring substrate according to Working Example 1 are mounted on the terminal portion. Note that FIGS. 6 and 7 are plan views of one substrate surface 31m (see FIG. 4) of the first flexible wiring substrate in Working Example 1 when viewed in the −Z direction. Hereinafter, the first flexible wiring substrate is referred to as a first flexible printed circuit (FPC) substrate, and the second flexible wiring substrate is referred to as a second FPC substrate.

As illustrated in FIG. 6, an external shape of the first FPC substrate 31A in Working Example 1 is rectangular, and two openings H1 and H2 and four monitor pads 312, 313, 314, and 315 are provided between a coupling terminal group 31t and the first driving IC 21. The openings H1 and H2 are an example of an opening of the other flexible wiring substrate or a first opening of the first flexible wiring substrate in the present disclosure, and the monitor pads 312, 313, 314, and 315 are an example of a first monitor pad of the first flexible wiring substrate in the present disclosure.

The first driving IC 21 includes a plurality of input terminals 21a to which various signals and various power supply voltages are input, and a plurality of output terminals 21b from which various signals are output. These input terminals 21a and output terminals 21b are formed on an active surface of the first driving IC 21 that is a bare chip. Note that FIG. 6 illustrates a state where the active surface of the first driving IC 21 is viewed in the −Z direction.

The two openings H1 and H2 are provided at a predetermined distance in the X direction so as to sandwich a wiring line group 311a coupled to the plurality of output terminals 21b of the first driving IC 21. A planar shape of the openings H1 and H2 is circular.

The monitor pad 313 is electrically coupled to wiring of an end of the wiring line group 311a in the −X direction. The monitor pad 312 is electrically coupled to a wiring line 311b adjacent in the −X direction to the wiring to which the monitor pad 313 is electrically coupled. The monitor pad 312 and the monitor pad 313 are disposed adjacent to each other in the +X direction.

The monitor pad 314 is electrically coupled to wiring of an end of the wiring line group 311a in the +X direction. The monitor pad 315 is electrically coupled to a wiring line 311c adjacent in the +X direction to the wiring to which the monitor pad 314 is electrically coupled. The monitor pad 314 and the monitor pad 315 are disposed adjacent to each other in the +X direction.

Note that, in the first FPC substrate 31A illustrated in FIG. 6, a plurality of wiring lines that are not coupled to the first driving IC 21 are supplied with any of the common voltage LCCOM, the reference voltage VSSY, and the drive voltage VDDY, which are the power supply voltages illustrated in FIG. 5.

In the first FPC substrate 31A of Working Example 1, with reference to a center line CL1 passing through the center in the X direction, the two openings H1 and H2 are provided in positions that are symmetrical in the X direction with respect to the center line CL1. The two openings H1 and H2 can be used as positioning holes for positioning the first terminal group 161 of the terminal portion 105 and the coupling terminal group 31t of the first FPC substrate 31A when the first FPC substrate 31A is mounted on the terminal portion 105 of the element substrate 101. Examples of a method for positioning the first terminal group 161 and the coupling terminal group 31t include a method for inserting a pair of guide pins vertically provided in a predetermined position with respect to the terminal portion 105 into the two openings H1 and H2 as positioning holes, and determining relative positions of the terminal portion 105 and the first FPC substrate 31A in the X direction and the Y direction, and the like. Further, relative positions of the terminal portion 105 and the first FPC substrate 31A in the X direction and the Y direction may be positioned by recognizing the two openings H1 and H2 as an image.

The monitor pad 312 and the monitor pad 313, which are adjacent to each other in the +X direction, are referred to as one set of monitor pads, and the monitor pad 314 and the monitor pad 315, which are also adjacent to each other in the +X direction, are referred to as the other set of monitor pads. Similarly to the two openings H1 and H2, the one set and the other set of monitor pads are provided in positions that are symmetrical in the X direction with respect to the center line CL1. Further, a distance in the X direction from a side portion on the − side in the X direction of the first FPC substrate 31A to the center of the opening H1 is the same as a distance in the X direction from the side portion on the − side in the X direction to the center of one set of monitor pads.

Similarly, a distance in the X direction from a side portion on the + side in the X direction of the first FPC substrate 31A to the center of the opening H2 is the same as a distance in the X direction from the side portion on the + side in the X direction to the center of the other set of monitor pads.

The size of the opening H1 is larger than the size of one set of monitor pads. Similarly, the size of the opening H2 is larger than the size of the other set of monitor pads. Note that the size of the opening H1 and the size of the opening H2 are the same, and a diameter is 1.5 mm to 2.0 mm, for example.

With respect to the first FPC substrate 31A in Working Example 1, the second FPC substrate 32A in Working Example 1 has the same design in shape and dimensions. In other words, two openings H3 and H4 and four monitor pads 322, 323, 324, and 325 are provided in the second FPC substrate 32A in Working Example 1. The two openings H3 and H4 are an example of a second opening of the second flexible wiring substrate in the present disclosure, and the four monitor pads 322, 323, 324, and 325 are an example of a second monitor pad of the second flexible wiring substrate in the present disclosure.

FIG. 7 is a plan view illustrating a state where the first FPC substrate 31A and the second FPC substrate 32A in Working Example 1 are mounted on the terminal portion 105 of the element substrate 101. As illustrated in FIG. 7, a distance L1 in the Y direction from an end portion on the coupling terminal group 31t side of the first FPC substrate 31A, namely, the first terminal group 161 side to the center of the opening H1 is the same as a distance L2 in the Y direction from an end portion on the coupling terminal group 32t side of the second FPC substrate 32A, namely, the second terminal group 162 side to the center of the opening H3. A distance L3 in the Y direction between the center of the opening H1 and the center of the opening H3 is the same as a deviation amount L4 in the Y direction between the first FPC substrate 31A and the second FPC substrate 32A, namely, an arrangement pitch in the Y direction between the first terminal group 161 and the second terminal group 162 on the terminal portion 105. A relative positional relationship between the opening H2 and the opening H4 is the same as the relative positional relationship between the opening H1 and the opening H3 described above. The distance in the Y direction between the center of the opening H3 and the center of the monitor pads 322 and 323 is the same as the distance in the Y direction between the center of the opening H1 and the center of the monitor pads 312 and 313, and is the same as the deviation amount L4, namely, the arrangement pitch in the Y direction between the first terminal group 161 and the second terminal group 162 on the terminal portion 105. Further, a distance in the Y direction between the center of the opening H4 and the center of the monitor pads 324 and 325 is the same as a distance in the Y direction between the center of the opening H2 and the center of the monitor pads 314 and 315, and is the same as the deviation amount L4, namely, the arrangement pitch in the Y direction between the first terminal group 161 and the second terminal group 162 on the terminal portion 105. Therefore, when the first FPC substrate 31A and the second FPC substrate 32A in Working Example 1 are mounted on the terminal portion 105 of the element substrate 101, the two monitor pads 322 and 323 of the second FPC substrate 32A are exposed from the opening H1 of the first FPC substrate 31A. Further, the two monitor pads 324 and 325 of the second FPC substrate 32A are exposed from the opening H2 of the first FPC substrate 31A.

According to the first FPC substrate 31A and the second FPC substrate 32A in Working Example 1 and the mounting state on the terminal portion 105, a signal output from four of the plurality of output terminals 21b of the first driving IC 21 via the four monitor pads 312, 313, 314, and 315 provided at the one substrate surface 31m of the first FPC substrate 31A can be monitored. Further, the four monitor pads 322, 323, 324, and 325 provided at the one substrate surface 32m of the second FPC substrate 32A are exposed from the two openings H1 and H2 provided in the first FPC substrate 31A, and thus a signal output from four of the plurality of output terminals of the second driving IC 22 via the four monitor pads 322, 323, 324, and 325 can be monitored.

Note that the signal detected from the four monitor pads 312, 313, 314, and 315 of the first FPC substrate 31A and the four monitor pads 322, 323, 324, and 325 of the second FPC substrate 32A is not limited to a signal related to image data, and may include a control signal such as a clock signal and the selection signal SEL. The size of each of the four monitor pads 312, 313, 314, and 315 of the first FPC substrate 31A and the four monitor pads 322, 323, 324, and 325 of the second FPC substrate 32A is, for example, a square with one side having a length of approximately 0.2 mm to 0.5 mm. The shape of the monitor pad is not limited to a square, and may be, for example, circular or elliptical. In Working Example 1, the monitor pad is provided so as to protrude from the wiring pattern, but the wiring pattern and the monitor pad may be integrated. In addition, the number of monitor pads provided at each of the first FPC substrate 31A and the second FPC substrate 32A is not limited to four, and may be one. In this case, there may be one opening provided in the first FPC substrate 31A.

1-3-2. Working Example 2

Figure 8:
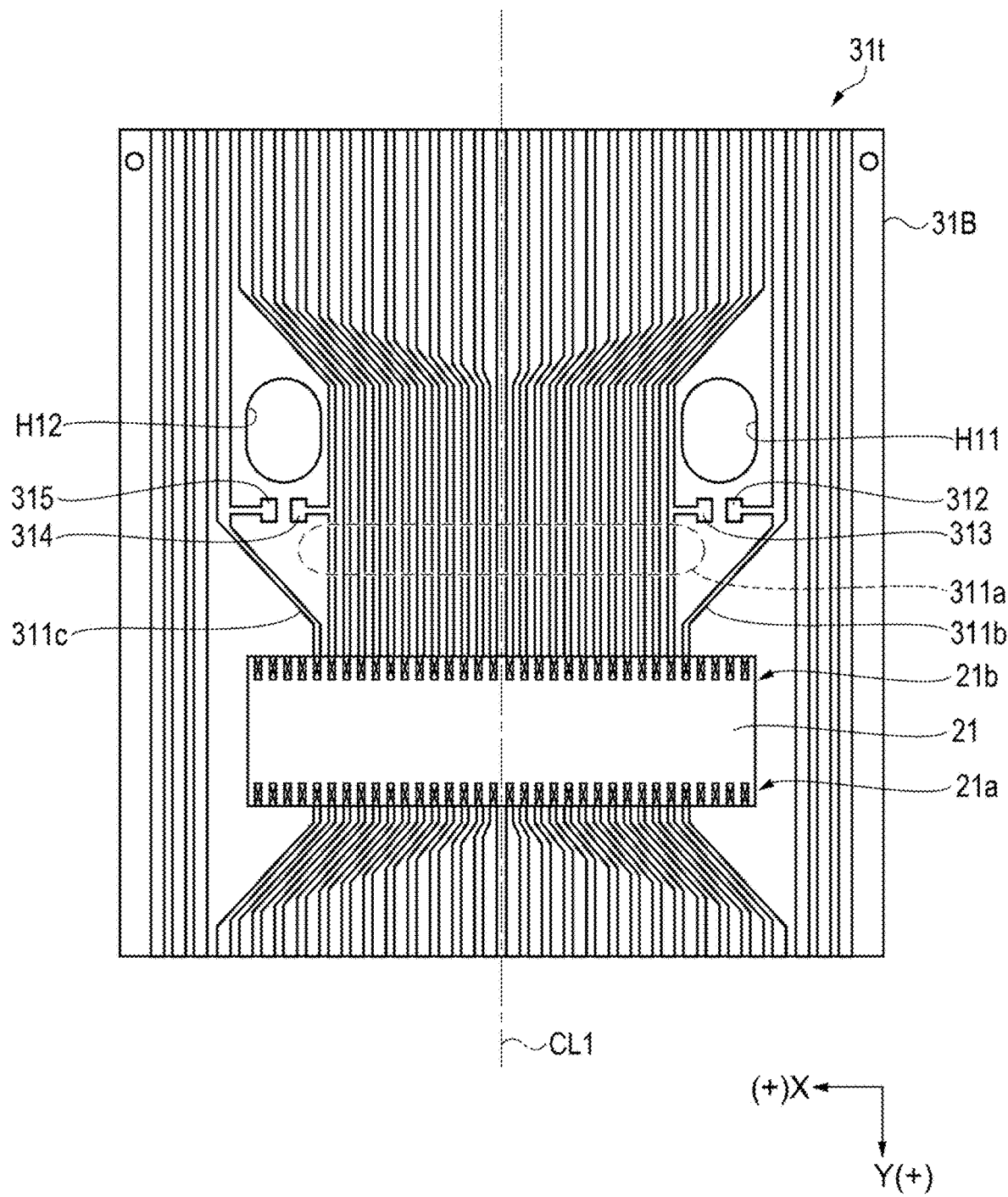
FIG. 8 is a plan view illustrating a configuration of a first flexible wiring substrate according to Working Example 2.
Figure 9:
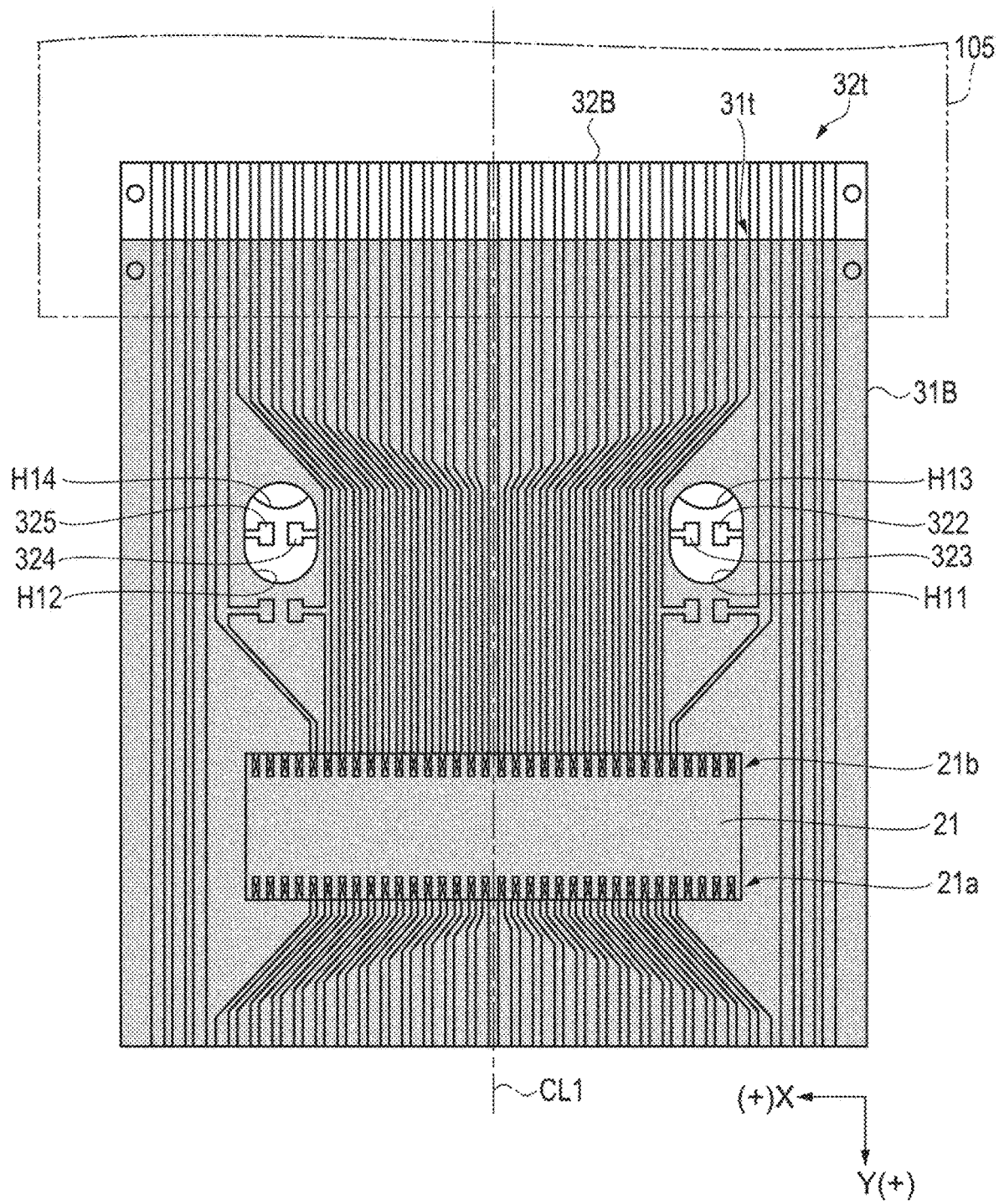
FIG. 9 is a plan view illustrating a state where the first flexible wiring substrate and a second flexible wiring substrate according to Working Example 2 are mounted on the terminal portion.

FIG. 8 is a plan view illustrating a configuration of a first flexible wiring substrate according to Working Example 2. FIG. 9 is a plan view illustrating a state where the first flexible wiring substrate and a second flexible wiring substrate according to Working Example 2 are mounted on the terminal portion. Note that FIGS. 8 and 9 are plan views of one substrate surface 31m (see FIG. 4) of the first flexible wiring substrate in Working Example 2 when viewed in the −Z direction.

As illustrated in FIG. 8, a first FPC substrate 31B in Working Example 2 has two openings H11 and H12 having a planar shape of a long hole elongated in the Y direction with respect to the first FPC substrate 31A in Working Example 1, and a length in the Y direction of the openings H11 and H12 is longer than a length in the X direction. In the first FPC substrate 31B in Working Example 2, a configuration other than the openings H11 and H12 is the same as the configuration of the first FPC substrate 31A in Working Example 1. In other words, the two openings H11 and H12 and four monitor pads 312, 313, 314, and 315 are provided in the first FPC substrate 31B in Working Example 2. The openings H11 and the opening H12 that are long holes are provided symmetrically in the X direction with respect to a center line CL1. Similarly, the monitor pads 312 and 313 and the monitor pads 314 and 315 are provided symmetrically in the X direction with respect to the center line CL1. A distance in the Y direction between the center of the opening H11 and the center of the monitor pads 312 and 313, namely, one set of monitor pads is the same as an arrangement pitch in the Y direction between the first terminal group 161 and the second terminal group 162 on the terminal portion 105 in the Y direction. A distance in the Y direction between the center of the opening H12 and the center of the monitor pads 314 and 315, namely, the other set of monitor pads is the same as the arrangement pitch in the Y direction between the first terminal group 161 and the second terminal group 162 on the terminal portion 105.

With respect to the first FPC substrate 31B in Working Example 2, a second FPC substrate 32B in Working Example 2 has the same design in shape and dimensions. In other words, the second FPC substrate 32B in Working Example 2 is provided with two openings H13 and H14 that are long holes, and four monitor pads 322, 323, 324, and 325. Therefore, when the first FPC substrate 31B and the second FPC substrate 32B in Working Example 2 are mounted on the terminal portion 105 of the element substrate 101, the two monitor pads 322 and 323 of the second FPC substrate 32B are exposed from the opening H11 of the first FPC substrate 31B, as illustrated in FIG. 9. Further, the two monitor pads 324 and 325 of the second FPC substrate 32B are exposed from the opening H12 of the first FPC substrate 31B. The openings H11 and H12 are an example of the first opening of the first flexible wiring substrate in the present disclosure, and the openings H13 and H14 are an example of the second opening of the second flexible wiring substrate in the present disclosure.

According to the first FPC substrate 31B and the second FPC substrate 32B in Working Example 2 and the mounting state on the terminal portion 105, a signal output from four of the plurality of output terminals 21b of the first driving IC 21 via the four monitor pads 312, 313, 314, and 315 provided at the one substrate surface 31m of the first FPC substrate 31B can be monitored. Further, the four monitor pads 322, 323, 324, and 325 provided at the one substrate surface 32m of the second FPC substrate 32B are exposed from the two openings H11 and H12 provided in the first FPC substrate 31B, and thus a signal output from four of the plurality of output terminals of the second driving IC 22 via the four monitor pads 322, 323, 324, and 325 can be monitored.

In addition, since the openings H11 and H12 provided in the first FPC substrate 31B are long holes elongated in the Y direction, the four monitor pads 322, 323, 324, and 325 can be reliably exposed from the openings H11 and H12 even when positional precision in the Y direction of the first FPC substrate 31B on the terminal portion 105 slightly varies. Further, even when the arrangement pitch between the first terminal group 161 and the second terminal group 162 in the Y direction is changed in design, with long holes elongated in the Y direction in anticipation of a predicted design change amount of the arrangement pitch, the four monitor pads 322, 323, 324, and 325 can be reliably exposed from the openings H11 and H12 without changing the design of the first FPC substrate 31B. The length of the openings H11 and H12 in the X direction is 1.5 mm to 2.0 mm, for example, and the length of the openings H11 and H12 in the Y direction is 2.0 mm to 2.5 mm, for example.

1-3-3. Working Example 3

Figure 10:
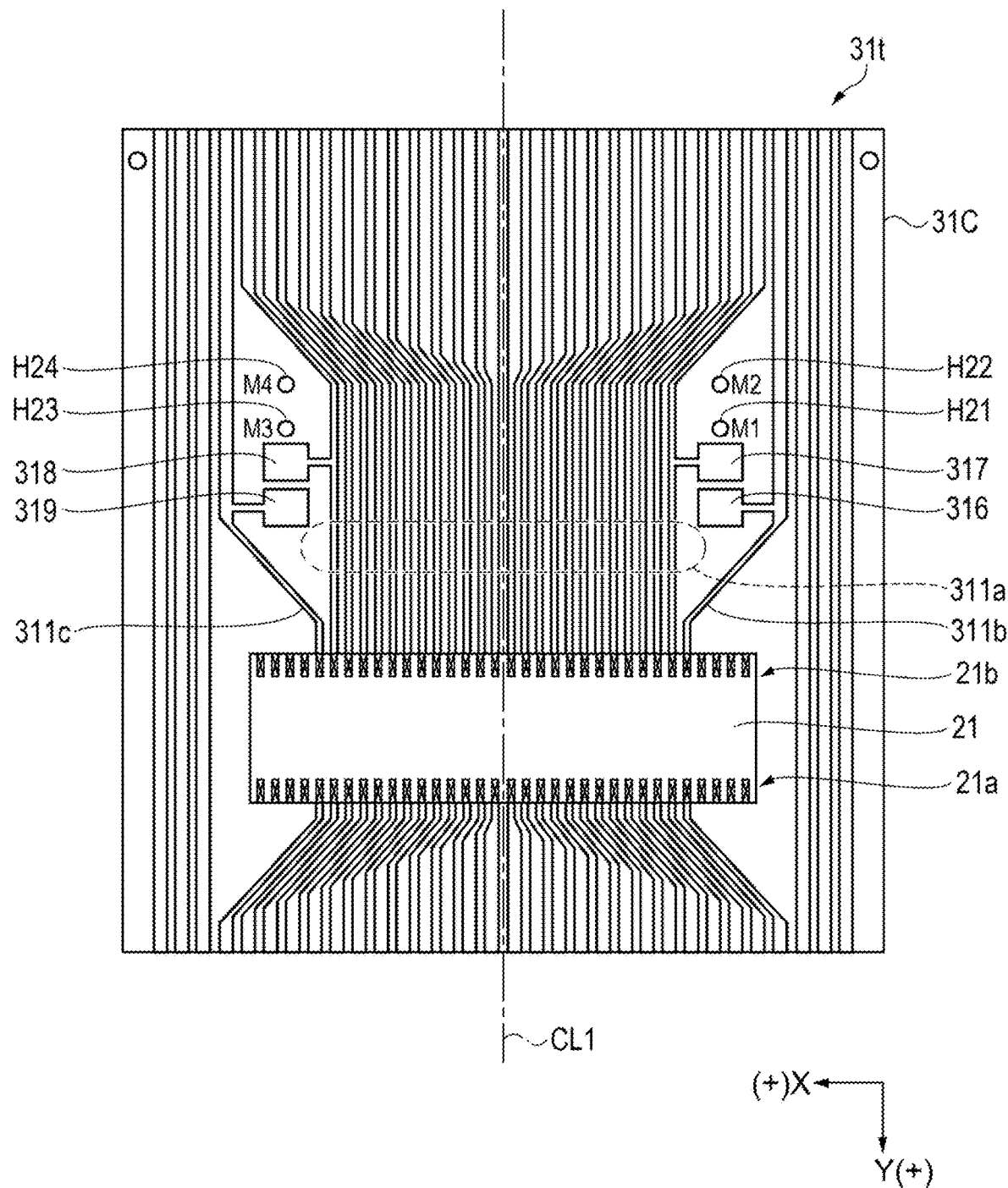
FIG. 10 is a plan view illustrating a configuration of a first flexible wiring substrate according to Working Example 3.
Figure 11:
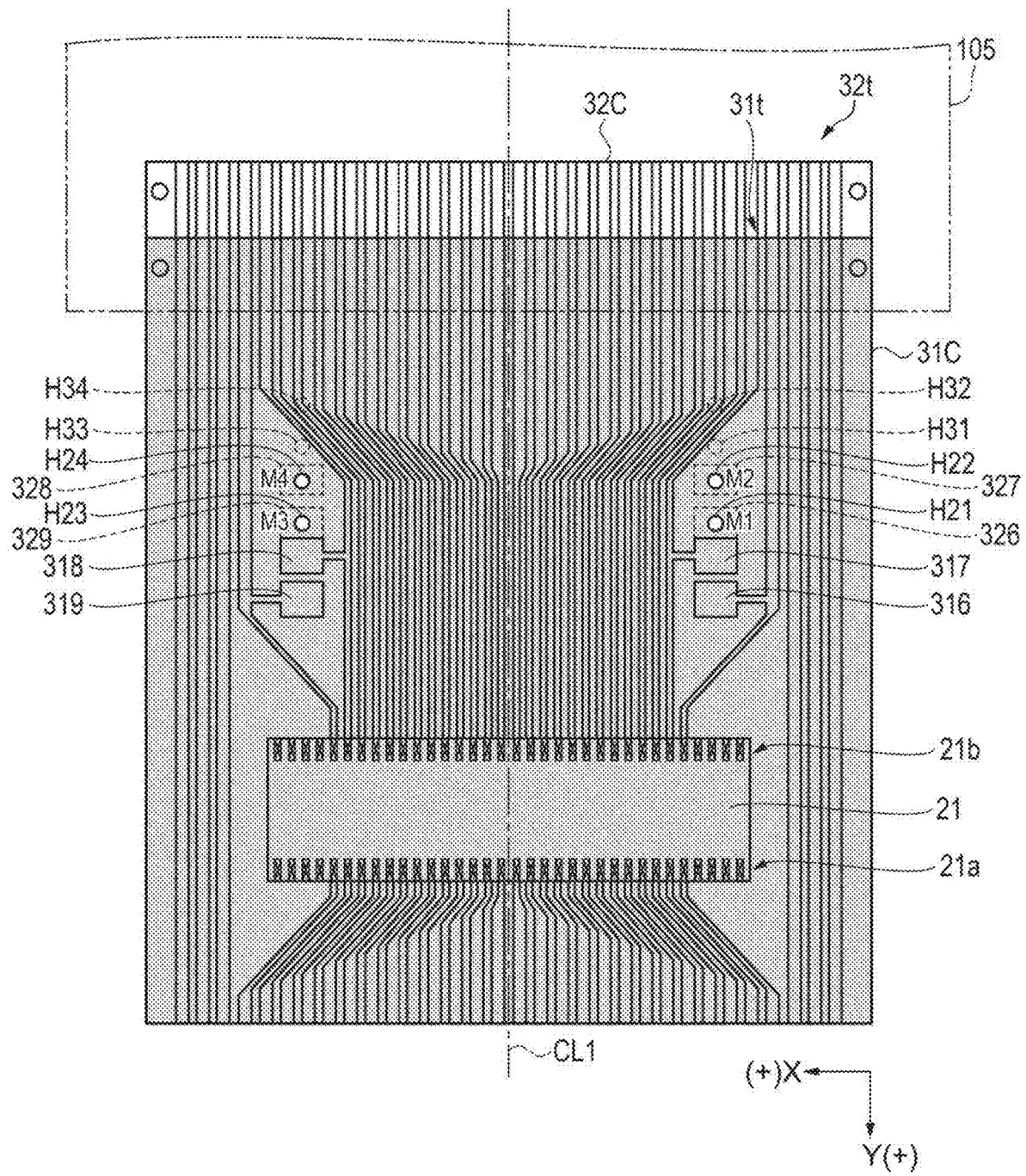
FIG. 11 is a plan view illustrating a state where the first flexible wiring substrate and a second flexible wiring substrate according to Working Example 3 are mounted on the terminal portion.

FIG. 10 is a plan view illustrating a configuration of a first flexible wiring substrate according to Working Example 3. FIG. 11 is a plan view illustrating a state where the first flexible wiring substrate and a second flexible wiring substrate according to Working Example 3 are mounted on the terminal portion. Note that FIGS. 10 and 11 are plan views of one substrate surface 31m (see FIG. 4) of the first flexible wiring substrate in Working Example 2 when viewed in the −Z direction.

As illustrated in FIG. 10, a first FPC substrate 31C in Working Example 3 has a configuration of an opening and a monitor pad different from that of the first FPC substrate 31A in Working Example 1. In the first FPC substrate 31C in Working Example 3, four openings H21, H22, H23, and H24 and four monitor pads 316, 317, 318, and 319 are provided between a coupling terminal group 31t and the first driving IC 21. The openings H21, H22, H23, and H24 are an example of the first opening of the first flexible wiring substrate in the present disclosure, and the monitor pads 316, 317, 318, and 319 are an example of the first monitor pad of the first flexible wiring substrate in the present disclosure.

Specifically, the opening H21 and the opening H23 are provided at a predetermined distance in the X direction with a wiring line group 311a interposed therebetween. Further, the opening H22 is provided at a predetermined distance in the −Y direction with respect to the opening H21. Similarly, the opening H24 is provided at a predetermined distance in the −Y direction with respect to the opening H23. The openings H21 and H22 and the openings H23 and H24 are provided symmetrically in the X direction with reference to a center line CL1.

The monitor pad 317 is electrically coupled to wiring of an end of the wiring line group 311a in the −X direction. The monitor pad 316 is electrically coupled to a wiring line 311b adjacent in the −X direction to the wiring to which the monitor pad 317 is electrically coupled. The monitor pad 316 and the monitor pad 317 are disposed adjacent to each other in the −Y direction.

The monitor pad 318 is electrically coupled to wiring of an end of the wiring line group 311a in the +X direction. The monitor pad 319 is electrically coupled to a wiring line 311c adjacent in the +X direction to the wiring to which the monitor pad 318 is electrically coupled. The monitor pad 318 and the monitor pad 319 are disposed adjacent to each other in the +Y direction.

Further, the monitor pad 316 and the monitor pad 317, which are adjacent to each other in the −Y direction, are referred to as one set of monitor pads, and the monitor pad 318 and the monitor pad 319, which are also adjacent to each other in the +Y direction, are referred to as the other set of monitor pads. Similarly to the two openings H21 and H23, the one set and the other set of monitor pads are provided in positions that are symmetrical in the X direction with respect to the center line CL1. A distance in the X direction from a side portion on the − side in the X direction of the first FPC substrate 31C to the center of the opening H21 is the same as a distance in the X direction from the side portion on the − side in the X direction to the center of one set of monitor pads. Further, a distance in the Y direction between the center of the opening H21 and the center of the monitor pad 316 is the same as a distance in the Y direction between the center of the opening H22 and the center of the monitor pad 317, and is the same as the arrangement pitch in the Y direction between the first terminal group 161 and the second terminal group 162 on the terminal portion 105.

Similarly, a distance in the X direction from a side portion on the + side in the X direction of the first FPC substrate 31C to the center of the opening H23 is the same as a distance in the X direction from the side portion on the + side in the X direction to the center of the other set of monitor pads. Further, a distance in the Y direction between the center of the opening H23 and the center of the monitor pad 319 is the same as a distance in the Y direction between the center of the opening H24 and the center of the monitor pad 318, and is the same as the arrangement pitch in the Y direction between the first terminal group 161 and the second terminal group 162 on the terminal portion 105.

The planar shape of the four openings H21, H22, H23, and H24 is circular in the same size. The size of the four monitor pads 316, 317, 318, and 319 is also the same. The size of each of the four openings H21, H22, H23, and H24 is smaller than the size of each of the four monitor pads 316, 317, 318, and 319.

With respect to the first FPC substrate 31C in Working Example 3, a second FPC substrate 32C in Working Example 3 has the same design in shape and dimensions. In other words, four openings H31, H32, H33, and H34 and four monitor pads 326, 327, 328, and 329 are provided in the second FPC substrate 32C in Working Example 3. Therefore, when the first FPC substrate 31C and the second FPC substrate 32C in Working Example 3 are mounted on the terminal portion 105 of the element substrate 101, the opening H21 of the first FPC substrate 31C is disposed so as to overlap the monitor pad 326 of the second FPC substrate 32C, as illustrated in FIG. 11. Further, the opening H22 of the first FPC substrate 31C is disposed so as to overlap the monitor pad 327 of the second FPC substrate 32C. Similarly, the opening H23 of the first FPC substrate 31C is disposed so as to overlap the monitor pad 329 of the second FPC substrate 32C. Further, the opening H24 of the first FPC substrate 31C is disposed so as to overlap the monitor pad 328 of the second FPC substrate 32C. The openings H31, H32, H33, and H34 are an example of the second opening of the second flexible wiring substrate in the present disclosure, and the monitor pads 316, 317, 318, and 319 are an example of the second monitor pad of the second flexible wiring substrate in the present disclosure.

As illustrated in FIGS. 10 and 11, an "M1", which is a letter for identifying a signal output from one of a plurality of output terminals 22b of the second driving IC 22 to which the monitor pad 326 of the second FPC substrate 32C is electrically coupled, is indicated near the opening H21 of the first FPC substrate 31C in Working Example 3. Similarly, an "M2", which is a letter for identifying a signal output from one of the plurality of output terminals 22b of the second driving IC 22 to which the monitor pad 327 of the second FPC substrate 32C is electrically coupled, is indicated near the opening H22 of the first FPC substrate 31C. An "M3", which is a letter for identifying a signal output from one of the plurality of output terminals 22b of the second driving IC 22 to which the monitor pad 329 of the second FPC substrate 32C is electrically coupled, is indicated near the opening H23 of the first FPC substrate 31C. An "M4", which is a letter for identifying a signal output from one of the plurality of output terminals 22b of the second driving IC 22 to which the monitor pad 328 of the second FPC substrate 32C is electrically coupled, is indicated near the opening H24 of the first FPC substrate 31C. The identifying letters "M1", "M2", "M3", and "M4" may be formed by patterning a wiring layer 311 of the first FPC substrate 31C, or may be printed by using a silk printing technique.

Figure 12:
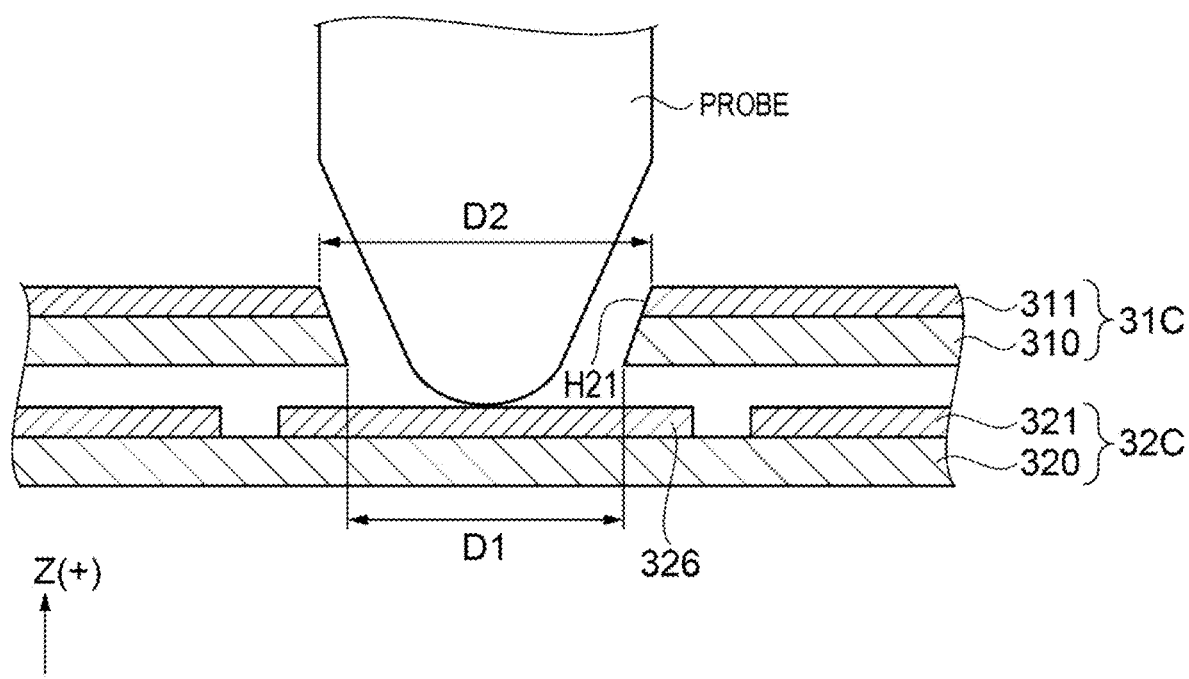
FIG. 12 is a schematic cross-sectional view illustrating a method for detecting a signal from a monitor pad of the second flexible wiring substrate according to Working Example 3.

FIG. 12 is a schematic cross-sectional view illustrating a method for detecting a signal from a monitor pad of the second flexible wiring substrate according to Working Example 3. Specifically, FIG. 12 is a schematic cross-sectional view corresponding to the monitor pad 326 of the second FPC substrate 32C in Working Example 3.

As illustrated in FIG. 12, the first FPC substrate 31C in Working Example 3 includes a base film 310 having flexibility and insulating properties, and the wiring layer 311 provided at one surface of the base film 310. Similarly, the second FPC substrate 32C in Working Example 3 includes a base film 320 having flexibility and insulating properties, and a wiring layer 321 provided at one surface of the base film 320. The monitor pad 326 is provided at the wiring layer 321. As described above, when the first FPC substrate 31C and the second FPC substrate 32C in Working Example 3 are mounted on the terminal portion 105 of the element substrate 101, the opening H21 of the first FPC substrate 31C is disposed so as to overlap the monitor pad 326 of the second FPC substrate 32C.

The opening H21 that penetrates the first FPC substrate 31C has a diameter D2 on the wiring layer 311 side larger than a diameter D1 on the base film 310 side, and has an inversely tapered shape in a cross-section. In this way, insertion of a probe can be performed smoothly.

When the probe for detection is inserted into the opening H21 and a tip of the probe contacts the monitor pad 326, a signal output from one of the plurality of output terminals 22b of the second driving IC 22 mounted on the second FPC substrate 32C can be monitored. In other words, the size of the diameters D1 and D2 of the opening H21 provided in the first FPC substrate 31C may be a size corresponding to a tip shape of the probe to be inserted. For example, the diameter D1 is 0.5 mm, and the diameter D2 is a value acquired by adding 0.05 mm to 0.2 mm to the diameter D1.

According to the first FPC substrate 31C and the second FPC substrate 32C in Working Example 3 and the mounting state on the terminal portion 105, a signal output from four of the plurality of output terminals 21b of the first driving IC 21 via the four monitor pads 316, 317, 318, and 319 provided at the one substrate surface 31m of the first FPC substrate 31C can be monitored. Further, the four monitor pads 326, 327, 328, and 329 provided at the second FPC substrate 32C are disposed so as to overlap the four openings H21, H22, H23, and H24 provided at the first FPC substrate 31C, and thus a signal output from four of the plurality of output terminals 22b of the second driving IC 22 via the four monitor pads 326, 327, 328, and 329 can be monitored.

Further, the size of the four openings H21, H22, H23, and H24 provided at the first FPC substrate 31C is smaller than the size of the four monitor pads 326, 327, 328, and 329 provided at the second FPC substrate 32C, and thus a signal output from four of the plurality of output terminals 22b of the second driving IC 22 via the four monitor pads 326, 327, 328, and 329 can be reliably monitored even when positional precision of the first FPC substrate 31C on the terminal portion 105 slightly varies. Further, since the four openings H21, H22, H23, and H24 function as a guide to the monitor pads 326, 327, 328, and 329, probing is facilitated.

Of the four monitor pads 316, 317, 318, and 319 of the first FPC substrate 31C in Working Example 3, the monitor pad 316 and the monitor pad 317 are disposed adjacent to each other in the −Y direction. Further, the monitor pad 318 and the monitor pad 319 are disposed adjacent to each other in the +Y direction. Similarly, of the four monitor pads 326, 327, 328, and 329 of the second FPC substrate 32C in Working Example 3, the monitor pad 326 and the monitor pad 327 are disposed adjacent to each other in the −Y direction. Further, the monitor pad 328 and the monitor pad 329 are disposed adjacent to each other in the +Y direction. In this way, disposing the plurality of monitor pads along the Y direction being the extending direction of the wiring in the flexible wiring substrate is less likely to add a constraint to the arrangement in the X direction of the plurality of wiring of the flexible wiring substrate as compared to a case in which a plurality of monitor pads are disposed along the X direction intersecting the Y direction. In other words, even when an area of the flexible wiring substrate is small, a plurality of monitor pads can be disposed. Alternatively, even when the size of a monitor pad is increased, a plurality of monitor pads can be disposed on the flexible wiring substrate.

The size of the four openings H21, H22, H23, and H24 provided in the first FPC substrate 31C in Working Example 3 is smaller than the size of the two openings H1 and H2 provided in the first FPC substrate 31A in Working Example 1 and the two openings H11 and H12 provided in the first FPC substrate 31B in Working Example 2. Therefore, the "M1 to M4", which are the letters for identifying a signal output from four of the plurality of output terminals 22b of the second driving IC 22 via the four monitor pads 326, 327, 328, and 329 provided at the second FPC substrate 32C, can be disposed so as to be visually recognizable around the four openings H21, H22, H23, and H24. Thus, a signal output from four of the plurality of output terminals 22b of the second driving IC 22 can be easily identified and checked. Note that the number of monitor pads and the number of openings corresponding to the monitor pads in Working Example 3 are not limited to four.

2. Second Embodiment

2-1. Electro-Optical Device

An electro-optical device according to a second embodiment will be described by exemplifying an active drive-type liquid crystal device similarly to the first embodiment. A liquid crystal device 2 as the electro-optical device in the second embodiment has basically the same configuration as that of the liquid crystal device 1 in the first embodiment, and includes a liquid crystal panel 100 as an electro-optical panel and a holder 70 that holds the liquid crystal panel 100 (see FIG. 1). On the other hand, the liquid crystal device 2 in the second embodiment differs in a configuration of a first mounting substrate and a second mounting substrate mounted on a terminal portion 105 of the liquid crystal panel 100. Hereinafter, the same configuration as the configuration in the liquid crystal device 1 in the first embodiment is denoted by the same reference sign, and detailed description of the same configuration will be omitted. Further, similarly to the first embodiment, the first flexible wiring substrate is referred to as a first FPC substrate, and the second flexible wiring substrate is referred to as a second FPC substrate.

Figure 13:
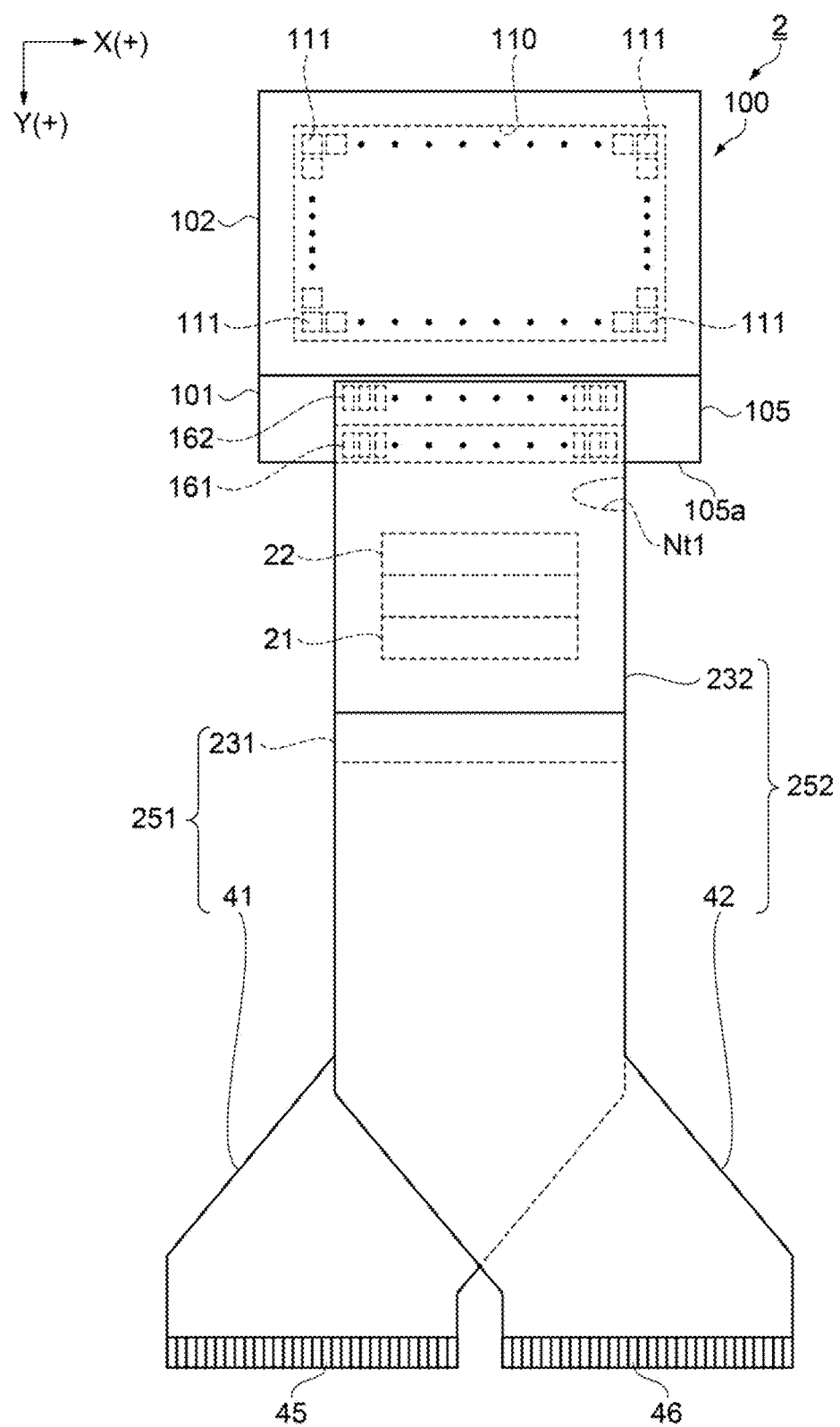
FIG. 13 is a plan view illustrating a liquid crystal panel electrically coupled to a first mounting substrate and a second mounting substrate according to a second embodiment.

FIG. 13 is a plan view illustrating the liquid crystal panel electrically coupled to the first mounting substrate and the second mounting substrate according to the second embodiment.

As illustrated in FIG. 13, in the liquid crystal device 2 serving as the electro-optical device in the present embodiment, the liquid crystal panel 100 is an active drive-type, and a plurality of pixels 111 are arranged in matrix in the X direction and the Y direction in a display region 110.

The liquid crystal panel 100 includes an element substrate 101 and a counter substrate 102 disposed so as to face each other. A first mounting substrate 251 and a second mounting substrate 252 are mounted on the terminal portion 105 of the element substrate 101. Specifically, the first mounting substrate 251 is constituted of a first FPC substrate 231 at which a first driving IC 21 is mounted, and a first extending substrate 41 electrically coupled to the first FPC substrate 231. The second mounting substrate 252 is constituted of a second FPC substrate 232 at which a second driving IC 22 is mounted, and a second extending substrate 42 electrically coupled to the second FPC substrate 232. The terminal portion 105 of the element substrate 101 is provided with a first terminal group 161 and a second terminal group 162.

The first FPC substrate 231 of the first mounting substrate 251 is electrically coupled to the first terminal group 161. The second FPC substrate 232 of the second mounting substrate 252 is electrically coupled to the second terminal group 162. The first extending substrate 41 electrically coupled to the first FPC substrate 231 has an end portion in the +Y direction bent in the −X direction. In contrast, the second extending substrate 42 electrically coupled to the second FPC substrate 232 has an end portion in the +Y direction bent in the +X direction. A first input terminal 45 is provided at the end portion of the first extending substrate 41 in the +Y direction. A second input terminal 46 is provided at the end portion of the second extending substrate 42 in the +Y direction. In plan view, the first input terminal 45 and the second input terminal 46 are aligned linearly in the +X direction. According to such first mounting substrate 251 and second mounting substrate 252, the first input terminal 45 of the first extending substrate 41 can be coupled to one connector of two connectors placed on an external circuit substrate, and the second input terminal 46 of the second extending substrate 42 can be coupled to the other connector. In other words, when the first extending substrate 41 is coupled to the one connector, the second extending substrate 42 is configured so as not to become an obstacle. Note that the shape of the first extending substrate 41 and the second extending substrate 42 is not limited to a bent state, but may be a straight shape.

On the terminal portion 105 of the element substrate 101, the second FPC substrate 232 is disposed so as to overlap the first FPC substrate 231. A monitor pad is provided at the second FPC substrate 232, and a notch portion Nt1 acquired by cutting a side portion along the Y direction of the first FPC substrate 231 is provided in a position overlapping the monitor pad. The notch portion Nt1 is an example of a notch portion of the other flexible wiring substrate or a first notch portion of the first flexible wiring substrate in the present disclosure. Hereinafter, Working Example of the first FPC substrate 231 and the second FPC substrate 232 will be described in detail.

2-2. Working Example of First Flexible Wiring Substrate and Second Flexible Wiring Substrate in Second Embodiment

2-2-1. Working Example 4

Figure 14:
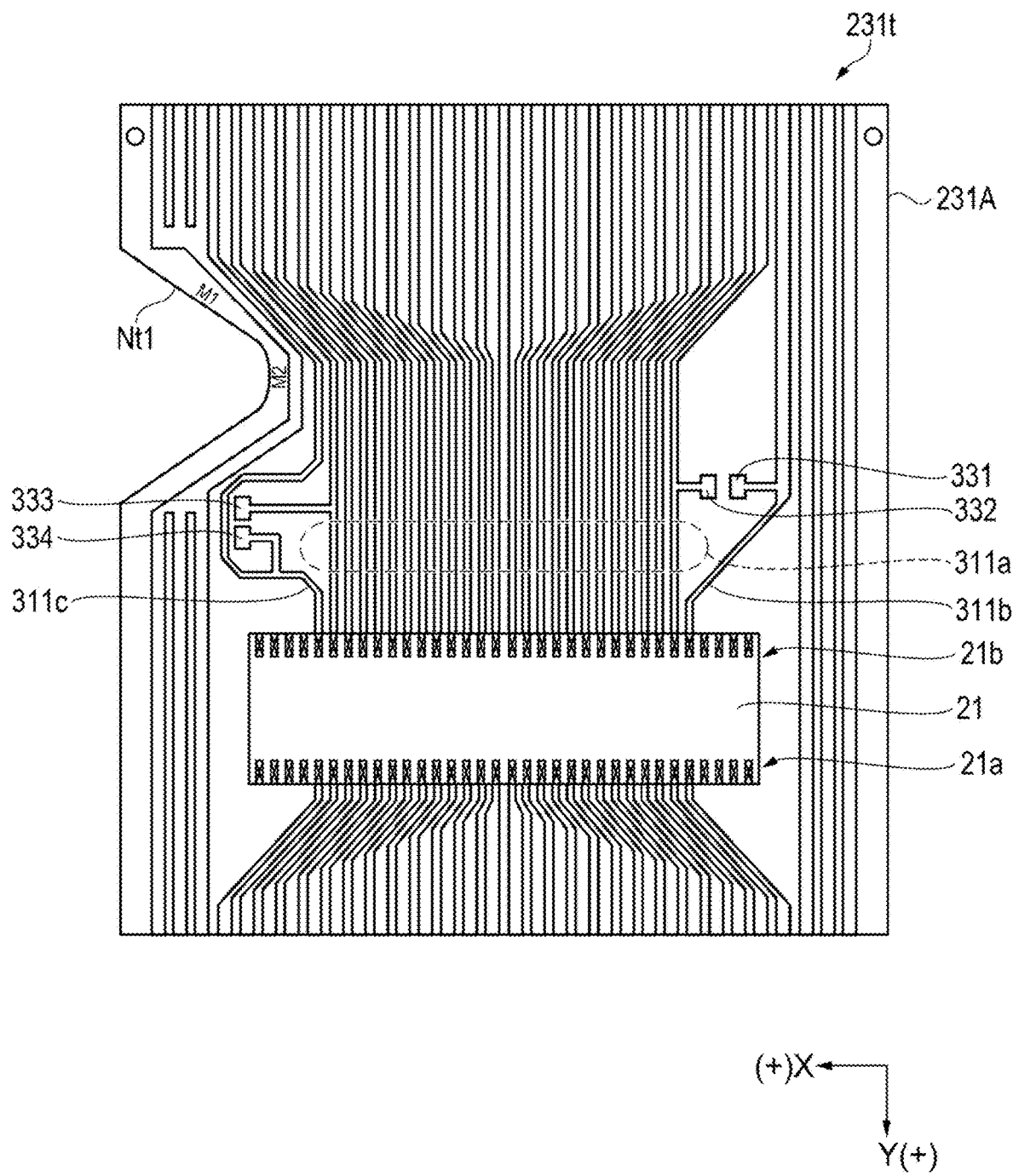
FIG. 14 is a plan view illustrating a configuration of a first flexible wiring substrate according to Working Example 4.
Figure 15:
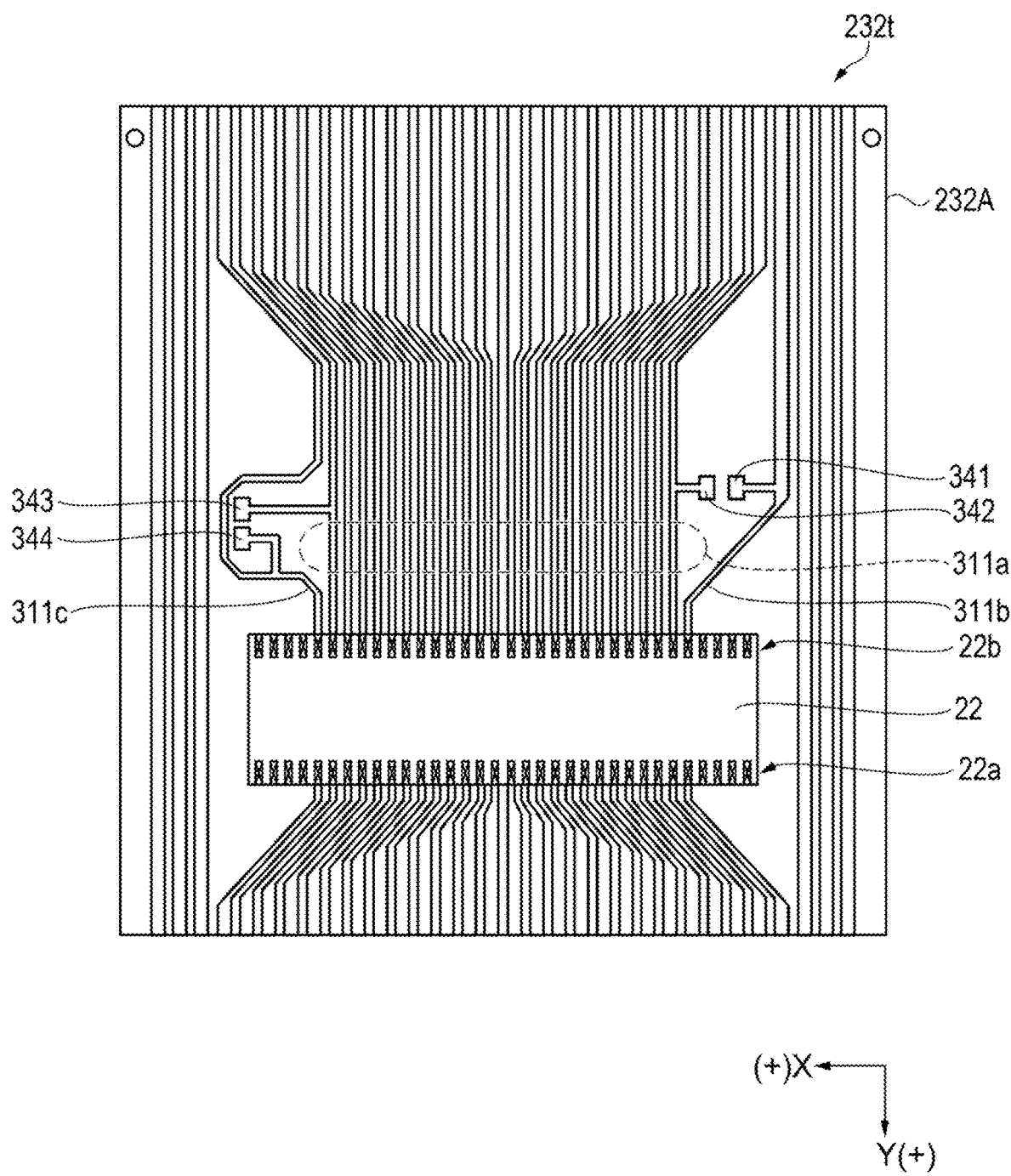
FIG. 15 is a plan view illustrating a configuration of a second flexible wiring substrate according to Working Example 4.
Figure 16:
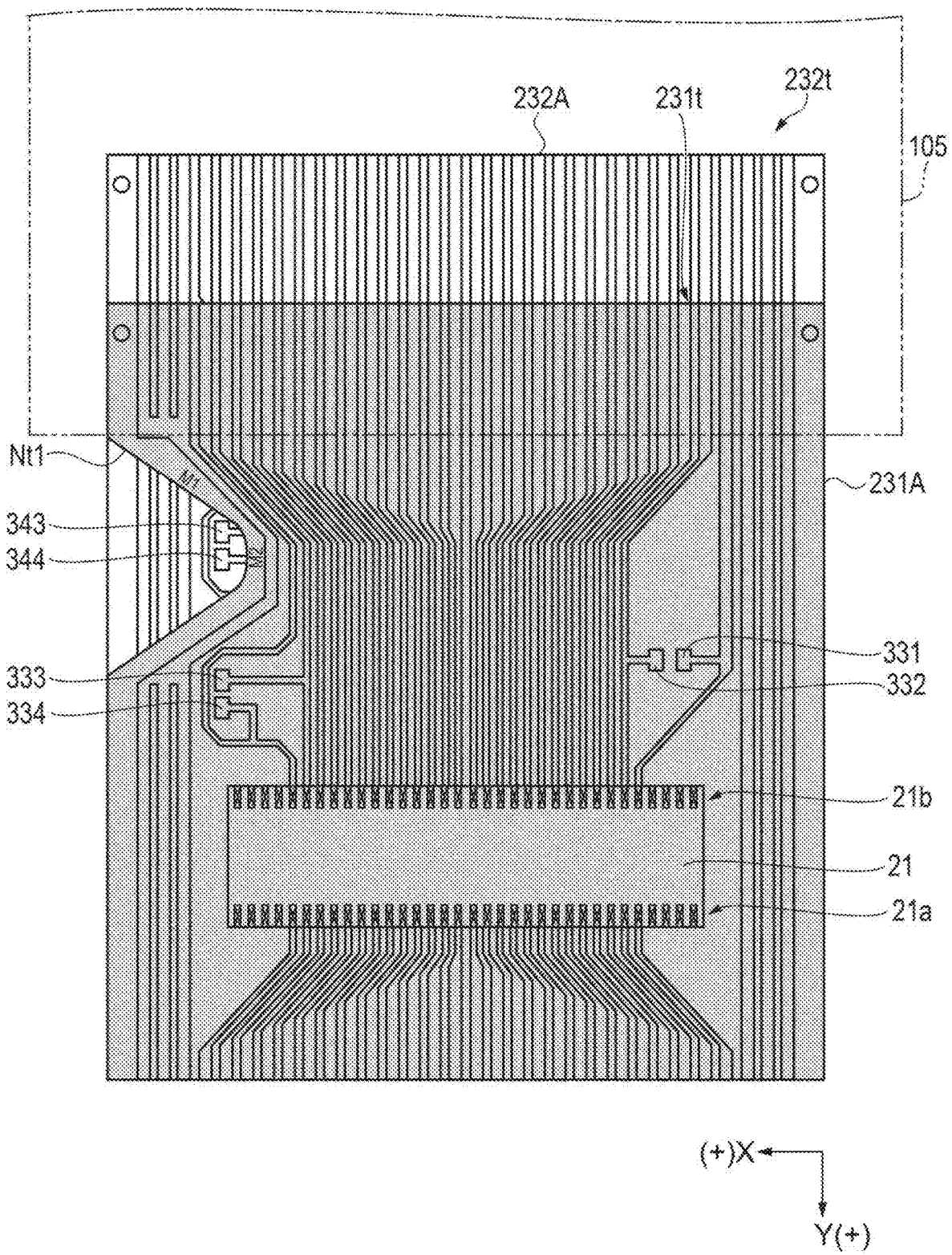
FIG. 16 is a plan view illustrating a state where the first flexible wiring substrate and the second flexible wiring substrate according to Working Example 4 are mounted on the terminal portion.

FIG. 14 is a plan view illustrating a configuration of a first flexible wiring substrate according to Working Example 4. FIG. 15 is a plan view illustrating a configuration of a second flexible wiring substrate according to Working Example 4. FIG. 16 is a plan view illustrating a state where the first flexible wiring substrate and the second flexible wiring substrate according to Working Example 4 are mounted on the terminal portion. Note that FIGS. 14 and 16 are plan views of one substrate surface 31m (see FIG. 4) of the first flexible wiring substrate in Working Example 4 when viewed in the −Z direction. FIG. 15 is a plan view of one substrate surface 32m (see FIG. 4) of the second flexible wiring substrate in Working Example 4 when viewed in the −Z direction. Further, FIGS. 14 to 16 illustrate a state where an active surface of a driving IC is viewed in the −Z direction.

As illustrated in FIG. 14, the first driving IC 21 is mounted on a first FPC substrate 231A in Working Example 4. The first driving IC 21 includes a plurality of input terminals 21a to which various signals and various power supply voltages are input, and a plurality of output terminals 21b from which various signals are output. These input terminals 21a and output terminals 21b are formed on an active surface of the first driving IC 21 that is a bare chip.

A wiring line group 311a, a wiring line 311b, and a wiring line 311c are coupled to the plurality of output terminals 21b. A coupling terminal group 231t is constituted of end portions in the −Y direction of the wiring line group 311a, the wiring line 311b, and the wiring line 311c. Four monitor pads 331, 332, 333, and 334 are provided between the coupling terminal group 231t and the first driving IC 21.

The monitor pad 332 is electrically coupled to wiring of an end of the wiring line group 311a in the −X direction. The monitor pad 331 is electrically coupled to the wiring line 311b adjacent in the −X direction to the wiring to which the monitor pad 332 is electrically coupled. The monitor pad 331 and the monitor pad 332 are disposed adjacent to each other in the +X direction.

The monitor pad 333 is electrically coupled to wiring of an end of the wiring line group 311a in the +X direction. The monitor pad 334 is electrically coupled to the wiring line 311c adjacent in the +X direction to the wiring to which the monitor pad 333 is electrically coupled. The monitor pad 333 and the monitor pad 334 are disposed adjacent to each other in the +Y direction.

The first FPC substrate 231A in Working Example 4 is provided with a notch portion Nt1 acquired by cutting a part of a side portion on the + side in the X direction of two side portions facing each other in the X direction. The notch portion Nt1 is provided between the coupling terminal group 231t and the monitor pad 333. The wiring line 311c to which the monitor pad 334 is electrically coupled bypasses the monitor pad 333, and also extends to the coupling terminal group 231t side after being bent along the notch portion Nt1.

The notch portion Nt1 is an example of a notch portion of the other flexible wiring substrate or the first notch portion of the first flexible wiring substrate in the present disclosure, and the monitor pads 331, 332, 333, and 334 are an example of the first monitor pad of the first flexible wiring substrate in the present disclosure.

Note that, in the first FPC substrate 231A illustrated in FIG. 14, a plurality of wiring lines that are not coupled to the first driving IC 21 are supplied with any of the common voltage LCCOM, the reference voltage VSSY, and the drive voltage VDDY, which are the power supply voltages illustrated in FIG. 5.

As illustrated in FIG. 15, the second driving IC 22 is mounted on a second FPC substrate 232A in Working Example 4. The second driving IC 22 includes a plurality of input terminals 22a to which various signals are input, and a plurality of output terminals 22b from which various signals are output. These input terminals 22a and output terminals 22b are formed on an active surface of the second driving IC 22 that is a bare chip. A wiring line group 311a, a wiring line 311b, and a wiring line 311c are coupled to the plurality of output terminals 22b. A coupling terminal group 232t is constituted of end portions in the −Y direction of the wiring line group 311a, the wiring line 311b, and the wiring line 311c. Four monitor pads 341, 342, 343, and 344 are provided between the coupling terminal group 232t and the second driving IC 22.

The monitor pad 342 is electrically coupled to wiring of an end of the wiring line group 311a in the −X direction. The monitor pad 341 is electrically coupled to the wiring line 311b adjacent in the −X direction to the wiring to which the monitor pad 342 is electrically coupled. The monitor pad 341 and the monitor pad 342 are disposed adjacent to each other in the +X direction.

The monitor pad 343 is electrically coupled to wiring of an end of the wiring line group 311a in the +X direction. The monitor pad 344 is electrically coupled to the wiring line 311c adjacent in the +X direction to the wiring to which the monitor pad 343 is electrically coupled. The monitor pad 343 and the monitor pad 344 are disposed adjacent to each other in the +Y direction.

The second FPC substrate 232A in Working Example 4 has a design in which the notch portion Nt1 is not provided in the first FPC substrate 231A. The wiring line 311c to which the monitor pad 344 is electrically coupled extends to the coupling terminal group 232t side after bypassing the monitor pad 343 and being bent.

The monitor pads 341, 342, 343, and 344 are an example of the second monitor pad of the second flexible wiring substrate in the present disclosure.

Note that, in the second FPC substrate 232A illustrated in FIG. 15, a plurality of wiring lines that are not coupled to the second driving IC 22 are supplied with any of the common voltage LCCOM, the reference voltage VSSY, and the drive voltage VDDY, which are the power supply voltages illustrated in FIG. 5.

When the first FPC substrate 231A and the second FPC substrate 232A in Working Example 4 are mounted on the terminal portion 105 of the element substrate 101, the two monitor pads 343 and 344 of the second FPC substrate 232A are exposed from the notch portion Nt1 of the first FPC substrate 231A, as illustrated in FIG. 16. In other words, when the first FPC substrate 231A and the second FPC substrate 232A in Working Example 4 are mounted on the terminal portion 105 of the element substrate 101, the notch portion Nt1 is provided in the first FPC substrate 231A such that the two monitor pads 343 and 344 of the four monitor pads 341, 342, 343, and 344 provided at the second FPC substrate 232A are exposed from the notch portion Nt1.

Further, in the first FPC substrate 231A, an "M1" and an "M2", which are letters for identifying a signal output from two coupling portions of the output terminals 22b of the second driving IC 22, are indicated in positions corresponding to the two monitor pads 343 and 344 exposed from the notch portion Nt1. The identifying letters "M1" and "M2" may be formed by patterning a wiring layer of the first FPC substrate 231A, or may be printed by using a silk printing technique.

According to the first FPC substrate 231A and the second FPC substrate 232A in Working Example 4 and the mounting state on the terminal portion 105, a signal output from four of the output terminals 21b of the first driving IC 21 via the four monitor pads 331, 332, 333, and 334 provided at the one substrate surface 31m of the first FPC substrate 231A can be monitored. Further, the two monitor pads 343 and 344 of the four monitor pads 341, 342, 343, and 344 provided at the second FPC substrate 232A are exposed from the notch portion Nt1 provided in the first FPC substrate 231A, and thus a signal output from two of the output terminals 22b of the second driving IC 22 via the two monitor pads 343 and 344 can be monitored while checking the identification letters "M1" and "M2".

Note that another notch portion may be provided in the first FPC substrate 231A so as to expose the remaining two monitor pads 341 and 342 provided at the second FPC substrate 232A. In this case, a constraint may occur on the arrangement of the wiring supplied with the common voltage LCCOM, the reference voltage VSSY, and the drive voltage VDDY, which are the power supply voltages in the first FPC substrate 231A, a resistance increases, and thus a hindrance may be caused in a supply of the power supply voltages. For this reason, the first FPC substrate 231A in Working Example 4 has a configuration in which the notch portion Nt1 is provided only on one side portion. Therefore, in order to expose the remaining two monitor pads 341 and 342 provided at the second FPC substrate 232A in consideration of supply of the power supply voltages, the opening H1 illustrated in Working Example 1 of the above-described first embodiment or the opening H11 being a long hole illustrated in Working Example 2 may be provided in the first FPC substrate 231A.

2-2-2. Working Example 5

Figure 17:
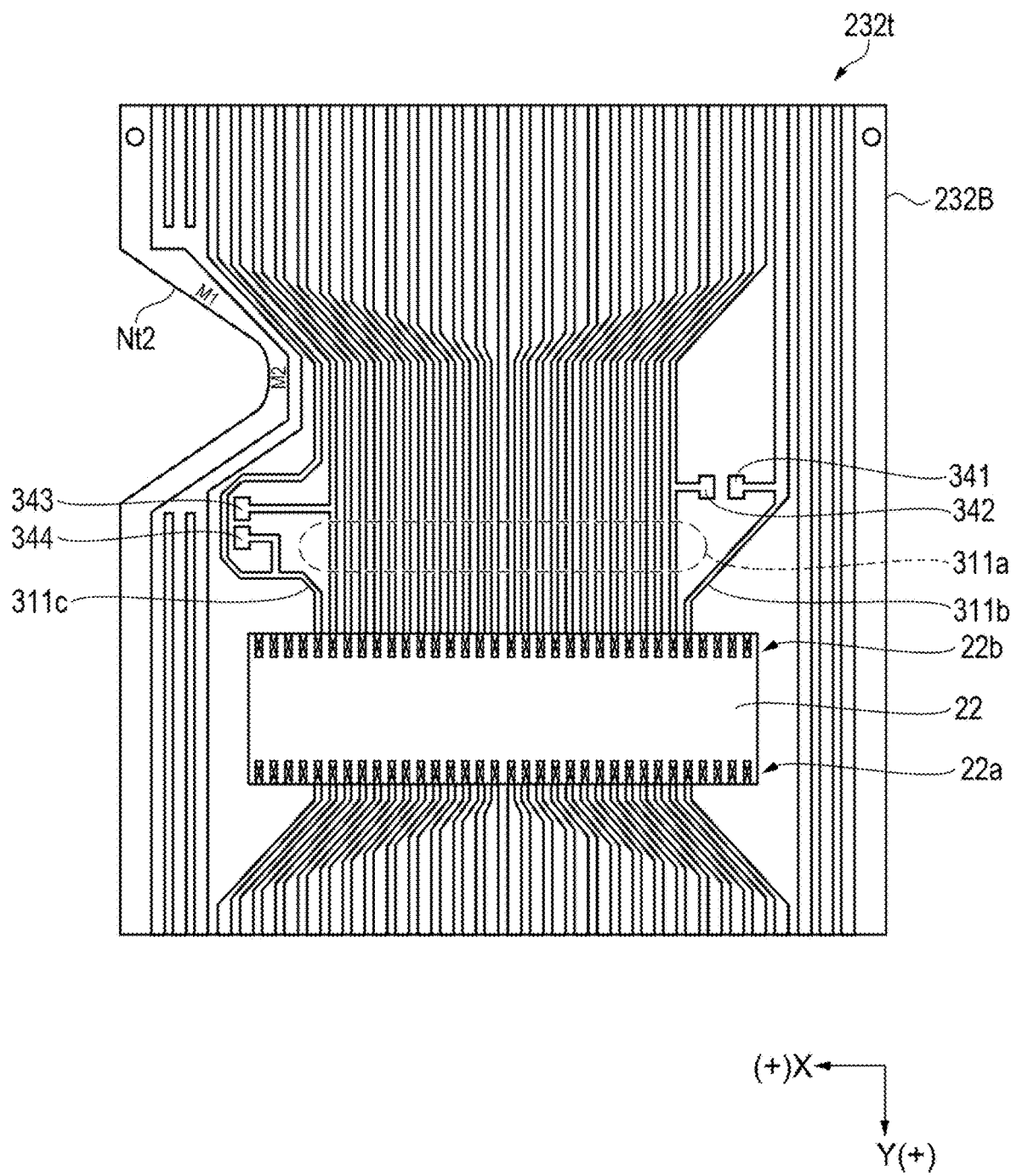
FIG. 17 is a plan view illustrating a configuration of a second flexible wiring substrate according to Working Example 5.
Figure 18:
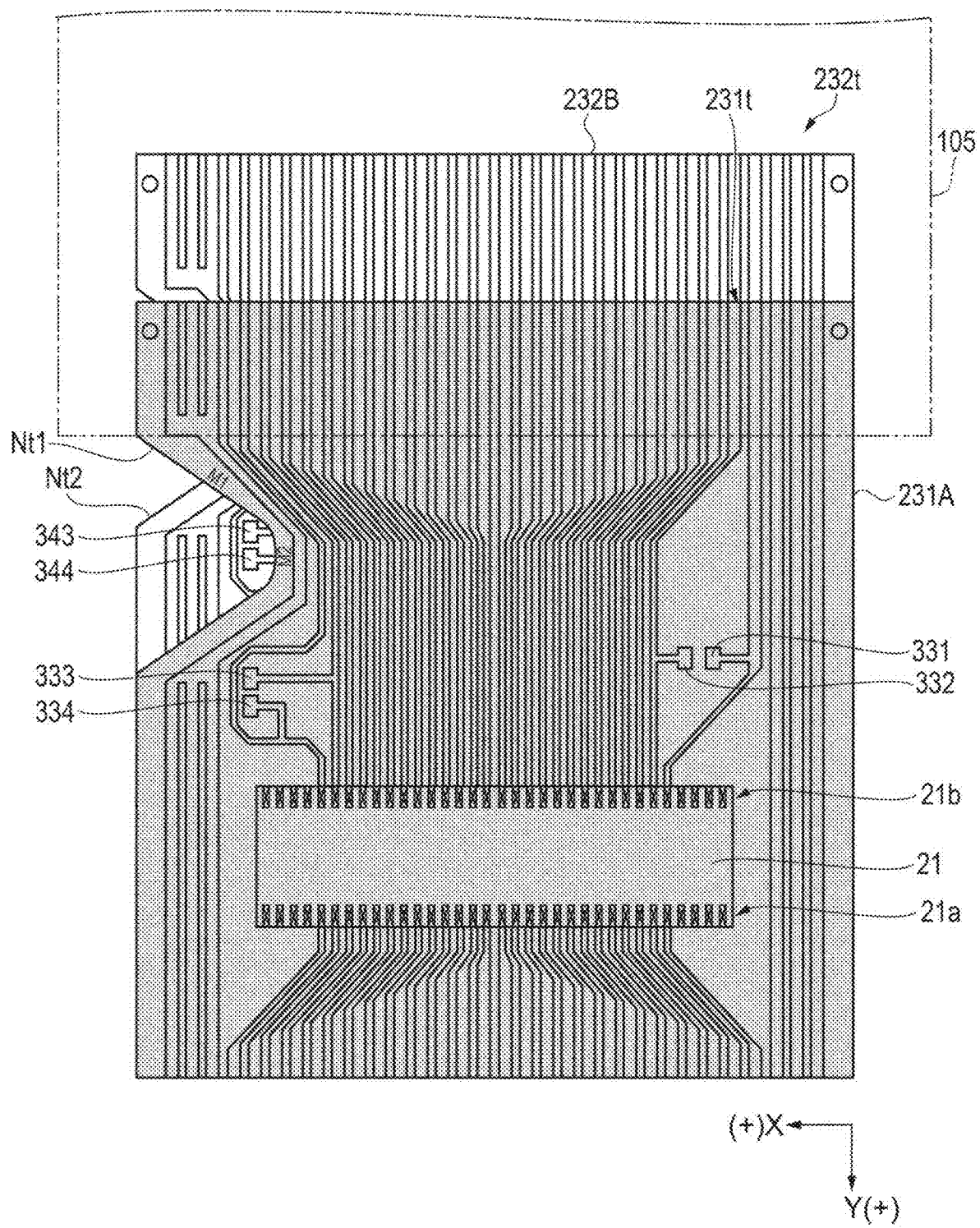
FIG. 18 is a plan view illustrating a state where the first flexible wiring substrate according to Working Example 4 and the second flexible wiring substrate according to Working Example 5 are mounted on the terminal portion.

FIG. 17 is a plan view illustrating a configuration of a second flexible wiring substrate according to Working Example 5. FIG. 18 is a plan view illustrating a state where the first flexible wiring substrate according to Working Example 4 and the second flexible wiring substrate according to Working Example 5 are mounted on the terminal portion. Note that FIGS. 17 and 18 are plan views of one substrate surfaces 31m (see FIG. 4) of the first flexible wiring substrate in Working Example 4 when viewed in the −Z direction.

As illustrated in FIG. 17, a second FPC substrate 232B in Working Example 5 has the same basic design as that of the first FPC substrate 231A in Working Example 4. Specifically, the second driving IC 22 is mounted on the second FPC substrate 232B in Working Example 5. Four monitor pads 341, 342, 343, and 344 are provided between a coupling terminal group 232t and the second driving IC 22.

The monitor pad 342 is electrically coupled to wiring of an end of a wiring line group 311a in the −X direction. The monitor pad 341 is electrically coupled to a wiring line 311b adjacent in the −X direction to the wiring to which the monitor pad 342 is electrically coupled. The monitor pad 341 and the monitor pad 342 are disposed adjacent to each other in the +X direction.

The monitor pad 343 is electrically coupled to wiring of an end of the wiring line group 311a in the +X direction. The monitor pad 344 is electrically coupled to a wiring line 311c adjacent in the +X direction to the wiring to which the monitor pad 343 is electrically coupled. The monitor pad 343 and the monitor pad 344 are disposed adjacent to each other in the +Y direction.

The second FPC substrate 232B in Working Example 5 is provided with a notch portion Nt2 acquired by cutting a part of a side portion on the + side in the X direction. The notch portion Nt2 is provided between the coupling terminal group 232t and the monitor pad 343. The wiring line 311c to which the monitor pad 344 is electrically coupled bypasses the monitor pad 343, and also extends to the coupling terminal group 232t side after being bent along the notch portion Nt2.

The notch portion Nt2 is an example of a second notch portion of the second flexible wiring substrate in the present disclosure, and the monitor pads 341, 342, 343, and 344 are an example of the second monitor pad of the second flexible wiring substrate in the present disclosure.

Note that, in the second FPC substrate 232B illustrated in FIG. 17, a plurality of wiring lines that are not coupled to the second driving IC 22 are supplied with any of the common voltage LCCOM, the reference voltage VSSY, and the drive voltage VDDY, which are the power supply voltages illustrated in FIG. 5.

When the first FPC substrate 231A in Working Example 4 and the second FPC substrate 232B in Working Example 5 are mounted on the terminal portion 105 of the element substrate 101, the two monitor pads 343 and 344 of the second FPC substrate 232B are exposed from the notch portion Nt1 of the first FPC substrate 231A, as illustrated in FIG. 18.

Therefore, according to the first FPC substrate 231A in Working Example 4 and the second FPC substrate 232B in Working Example 5 and the mounting state on the terminal portion 105, a signal output from four of the output terminals 21b of the first driving IC 21 via the four monitor pads 331, 332, 333, and 334 provided at the one substrate surface 31m of the first FPC substrate 231A can be monitored. Further, the two monitor pads 343 and 344 of the four monitor pads 341, 342, 343, and 344 provided at the second FPC substrate 232B are exposed from the notch portion Nt1 provided in the first FPC substrate 231A, and thus a signal output from two of the output terminals 22b of the second driving IC 22 via the two monitor pads 343 and 344 can be monitored while checking the identification letters "M1" and "M2".

Furthermore, a distance in the Y direction between an end portion on the coupling terminal group 232t side of the second FPC substrate 232B in Working Example 5 and an end portion of the notch portion Nt2 is the same as a distance in the Y direction between an end portion of the coupling terminal group 231t side of the first FPC substrate 231A in Working Example 4 and an end portion of the notch portion Nt1, and a shape of the notch portion Nt1 is the same as a shape of the notch portion Nt2. In other words, the second FPC substrate 232B in Working Example 5 has the same basic design as that of the first FPC substrate 231A in Working Example 4, and thus a flexible wiring substrate as a component can be shared.

2-2-3. Working Example 6

Figure 19:
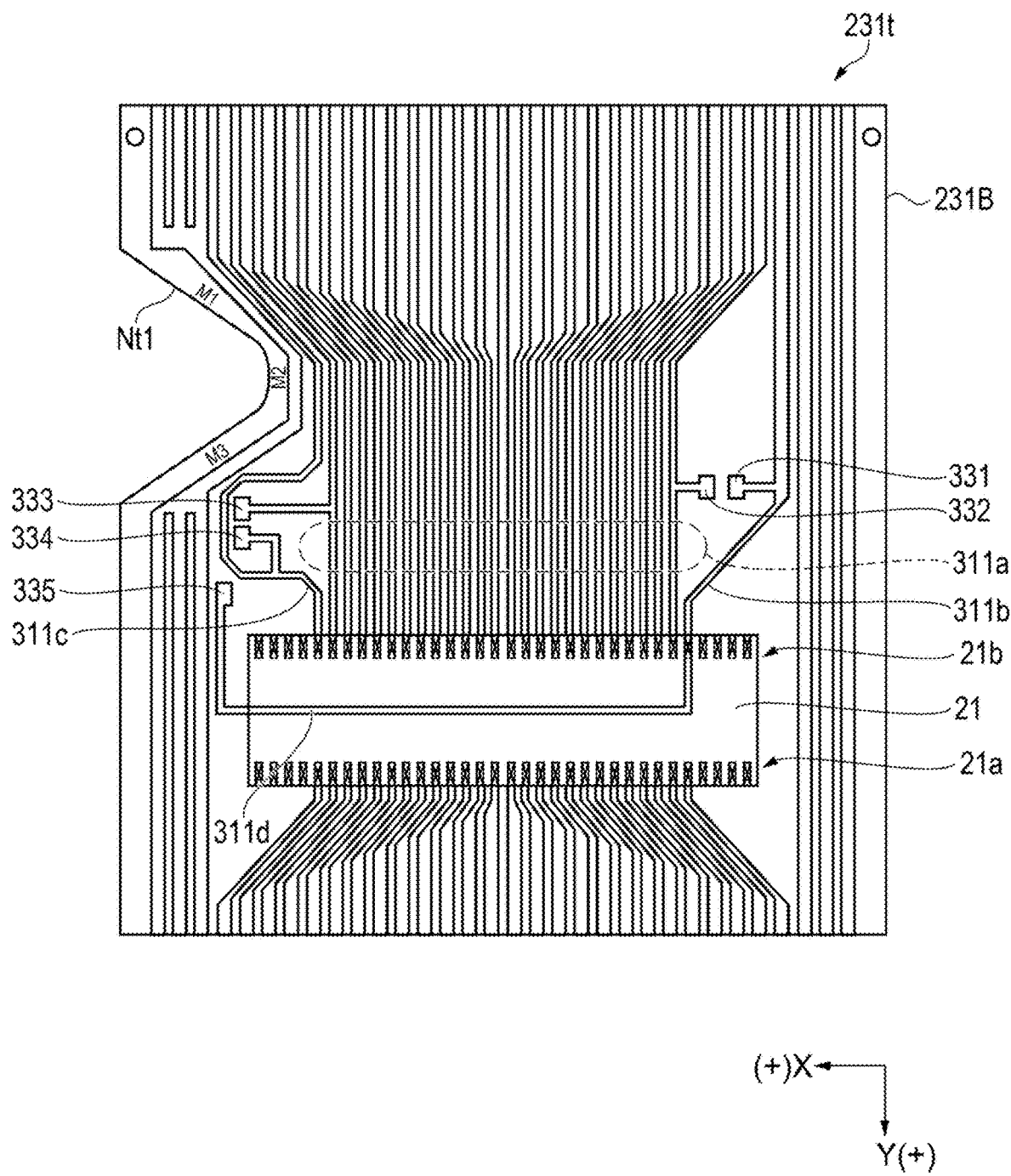
FIG. 19 is a plan view illustrating a configuration of a first flexible wiring substrate according to Working Example 6.
Figure 20:
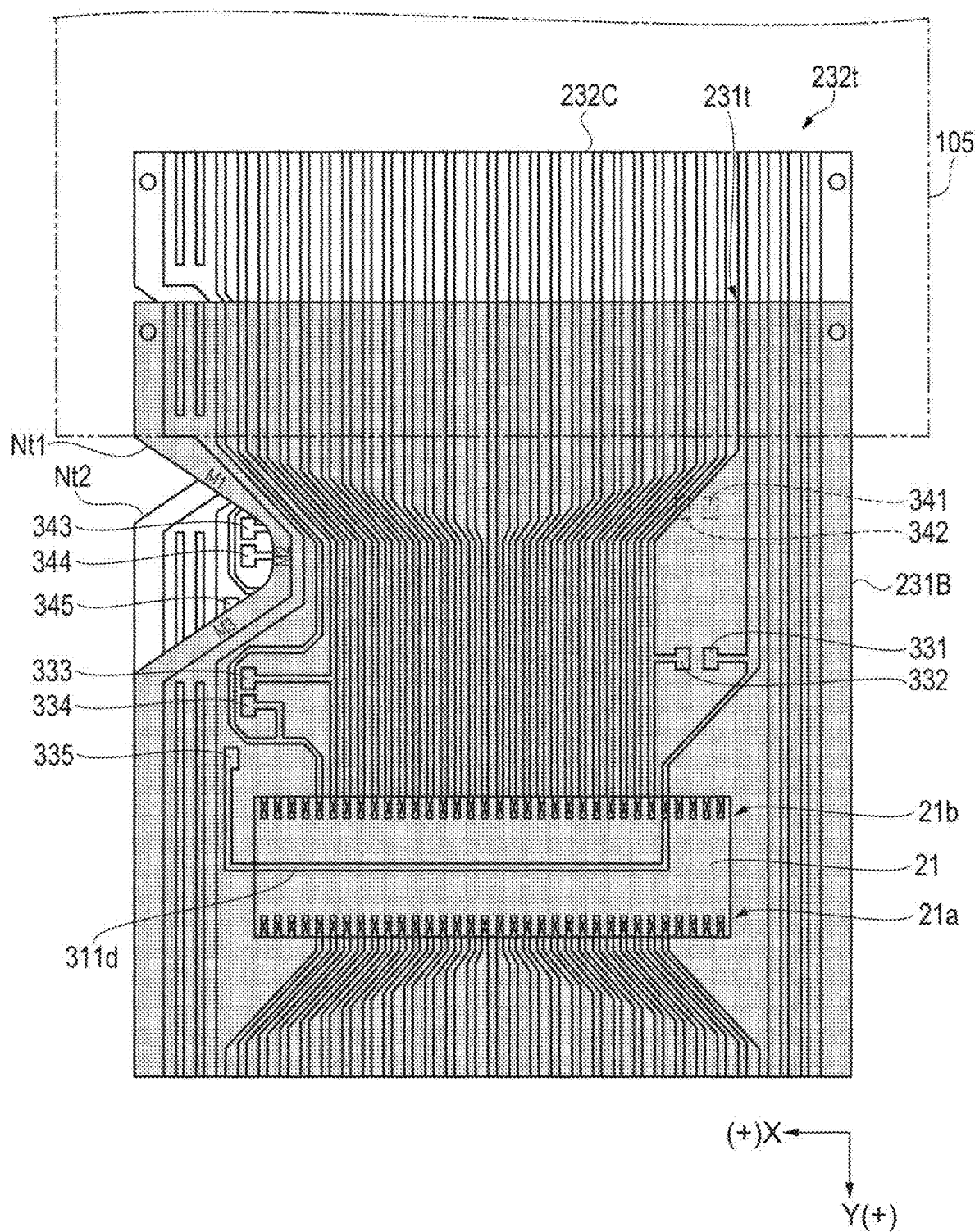
FIG. 20 is a plan view illustrating a state where the first flexible wiring substrate and a second flexible wiring substrate according to Working Example 6 are mounted on the terminal portion.

FIG. 19 is a plan view illustrating a configuration of a first flexible wiring substrate according to Working Example 6. FIG. 20 is a plan view illustrating a state where the first flexible wiring substrate and a second flexible wiring substrate according to Working Example 6 are mounted on the terminal portion. Note that FIGS. 19 and 20 are plan views of one substrate surface 31m (see FIG. 4) of the first flexible wiring substrate in Working Example 6 when viewed in the −Z direction.

A first FPC substrate 231B in Working Example 6 has a configuration of wiring and monitor pads different from that of the first FPC substrate 231A in Working Example 4. Further, a second FPC substrate 232C in Working Example 6 has the same basic design as that of the first FPC substrate 231B in Working Example 6.

Specifically, as illustrated in FIG. 19, the first driving IC 21 is mounted on the first FPC substrate 231B in Working Example 6. The first driving IC 21 includes a plurality of input terminals 21a to which various signals and various power supply voltages are input, and a plurality of output terminals 21b from which various signals are output. These input terminals 21a and output terminals 21b are formed on an active surface of the first driving IC 21 that is a bare chip. A wiring line group 311a, a wiring line 311b, and a wiring line 311c are coupled to the plurality of output terminals 21b. A coupling terminal group 231t is constituted of end portions in the −Y direction of the wiring line group 311a, the wiring line 311b, and the wiring line 311c. Five monitor pads 331, 332, 333, 334, and 335 are provided between the coupling terminal group 231t and the first driving IC 21. Of the five monitor pads 331, 332, 333, 334, and 335, the four monitor pads 331, 332, 333, and 334 have the same configuration as that of the first FPC substrate 231A in Working Example 4. The monitor pad 335 is provided near the monitor pad 334.

The first FPC substrate 231B in Working Example 6 is provided with a wiring line 311d coupled to the output terminal 21b of the first driving IC 21 to which the monitor pad 331 is electrically coupled. The wiring line 311d extends in the +X direction so as to overlap an active surface of the first driving IC 21, and also extends in the −Y direction in a position outside the active surface and is coupled to the monitor pad 335.

The first FPC substrate 231B in Working Example 6 is provided with a notch portion Nt1 acquired by cutting a part of a side portion on the + side in the X direction. The notch portion Nt1 is provided between the coupling terminal group 231*t* and the monitor pad 333. The wiring line 311*c* to which the monitor pad 334 is electrically coupled passes between the monitor pad 334 and the monitor pad 335 and bypasses the monitor pad 333, and also extends to the coupling terminal group 231*t* side after being bent along the notch portion Nt1.

The notch portion Nt1 is an example of a notch portion of the other flexible wiring substrate or the first notch portion of the first flexible wiring substrate in the present disclosure, and the monitor pads 331, 332, 333, 334, and 335 are an example of the first monitor pad of the first flexible wiring substrate in the present disclosure.

Note that, in the first FPC substrate 231B illustrated in FIG. 19, a plurality of wiring lines that are not coupled to the first driving IC 21 are supplied with any of the common voltage LCCOM, the reference voltage VSSY, and the drive voltage VDDY, which are the power supply voltages illustrated in FIG. 5.

As described above, the second FPC substrate 232C in Working Example 6 has basically the same design as that of the first FPC substrate 231B. The second driving IC 22 is mounted on the second FPC substrate 232C. Five monitor pads 341, 342, 343, 344, and 345 are provided between a coupling terminal group 232*t* of the second FPC substrate 232C and the second driving IC 22. The monitor pad 345 is coupled to wiring coupled to the output terminal 22*b* of the second driving IC 22 to which the monitor pad 341 is electrically coupled.

Further, a notch portion Nt2 acquired by cutting a side portion on the + side in the X direction is provided between the coupling terminal group 232*t* of the second FPC substrate 232C and the monitor pad 343. The notch portion Nt2 is an example of the second notch portion of the second flexible wiring substrate in the present disclosure, and the monitor pads 341, 342, 343, 344, and 345 are an example of the second monitor pad of the second flexible wiring substrate in the present disclosure.

When the first FPC substrate 231B and the second FPC substrate 232C in Working Example 6 are mounted on the terminal portion 105 of the element substrate 101, the three monitor pads 343, 344 and 345 of the second FPC substrate 232C are exposed from the notch portion Nt1 of the first FPC substrate 231B, as illustrated in FIG. 20. In other words, when the first FPC substrate 231A and the second FPC substrate 232A in Working Example 6 are mounted on the terminal portion 105 of the element substrate 101, the notch portion Nt1 is provided in the first FPC substrate 231B in Working Example 6 such that the three monitor pads 343, 344, and 345 of the five monitor pads 341, 342, 343, 344, and 345 provided at the second FPC substrate 232C are exposed from the notch portion Nt1. Note that the notch portion Nt1 may be cut into a state where a probe can contact each of the three monitor pads 343, 344, and 345.

Further, in the first FPC substrate 231B, an "M1", an "M2" and an "M3", which are letters for identifying a signal output from three of the plurality of output terminals 22*b* of the second driving IC 22, are indicated in positions corresponding to the three monitor pads 343, 344, and 345 of the second FPC substrate 232C exposed from the notch portion Nt1. The identifying letters "M1", "M2", and "M3" may be formed by patterning a wiring layer of the first FPC substrate 231B or may be printed by using a silk printing technique.

According to the first FPC substrate 231B and the second FPC substrate 232C in Working Example 6 and the mounting state on the terminal portion 105, a signal output from four of the output terminals 21*b* of the first driving IC 21 via the four monitor pads 331, 332, 333, and 334 provided at the one substrate surface 31*m* of the first FPC substrate 231B can be monitored. Further, the three monitor pads 343, 344, and 345 of the five monitor pads 341, 342, 343, 344, and 345 provided at the second FPC substrate 232C are exposed from the notch portion Nt1 provided in the first FPC substrate 231B, and thus a signal output from three of the output terminals 22*b* of the second driving IC 22 via the three monitor pads 343, 344 and 345 can be monitored while checking the identification letters "M1", "M2", and "M3".

Note that the monitor pad 335 of the first FPC substrate 231B is not limited to being electrically coupled to the output terminal 21*b* of the first driving IC 21 to which the monitor pad 331 is electrically coupled. For example, the monitor pad 335 may be electrically coupled to the output terminal 21*b* of the first driving IC 21 to which the monitor pad 332 is electrically coupled. The same applies to the monitor pad 345 of the second FPC substrate 232C. In this way, a signal output from one of the plurality of output terminals 22*b* of the second driving IC 22 can be monitored by using the monitor pad 345 instead of the monitor pad 341 or the monitor pad 342 of the second FPC substrate 232C that is hidden by the first FPC substrate 231B due to mounting on the terminal portion 105.

According to the configuration of the first FPC substrate and the second FPC substrate in Working Examples 1 to 3 of the first embodiment and Working Examples 4 to 6 of the second embodiment described above, even when the second FPC substrate is mounted so as to overlap the first FPC substrate on the terminal portion 105 of the liquid crystal panel 100, not only a signal output from a part of the plurality of output terminals 21*b* of the first driving IC 21 but also a signal output from a part of the plurality of output terminals 22*b* of the second driving IC 22 can be detected by bringing a tip of a probe into contact with the monitor pad provided corresponding to each of the FPC substrates from the first FPC substrate side. By detecting the signal, it is possible to easily check for whether or not the liquid crystal panel 100 is normally operated by an image signal, a clock signal, various control signals, and the like output from the first driving IC 21 and the second driving IC 22, and display is performed.

3. Third Embodiment 3.1. Electronic Apparatus

Figure 21:
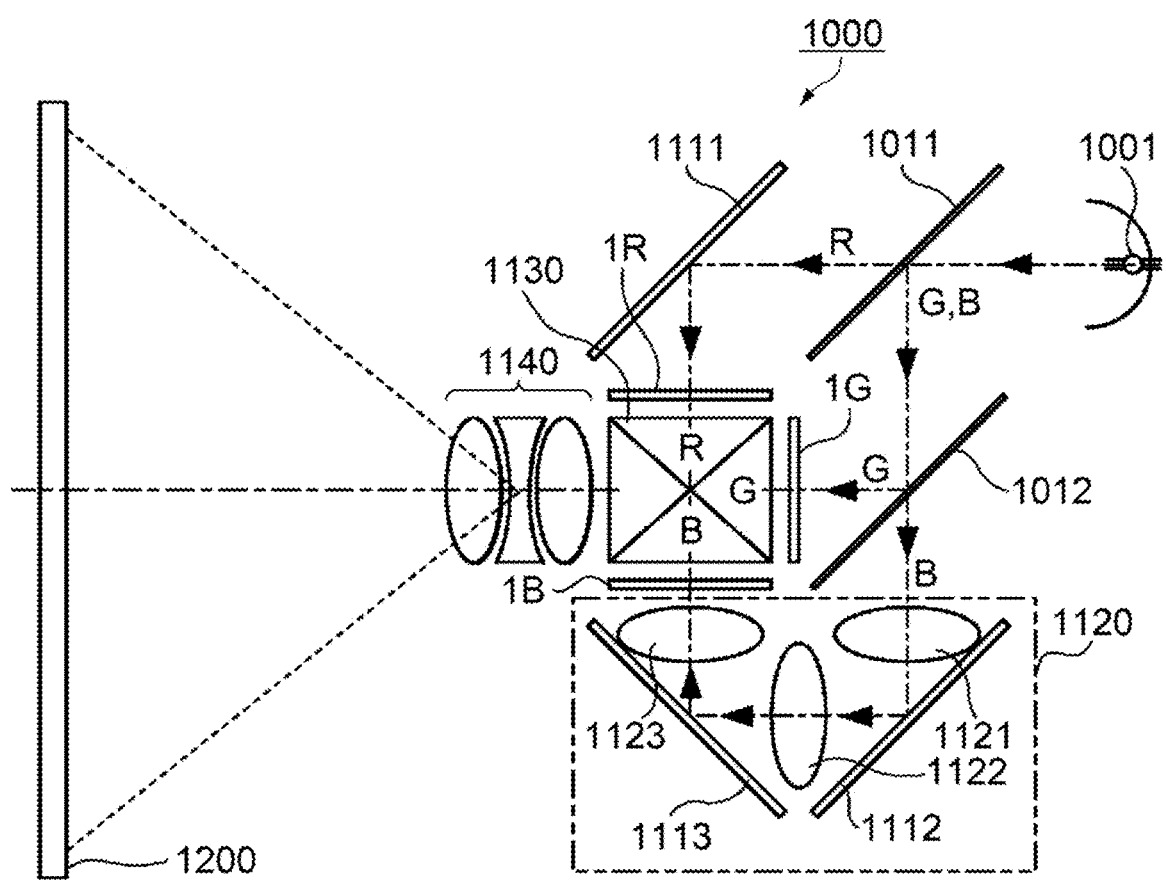
FIG. 21 is a view schematically illustrating a configuration of a projection-type display apparatus as an electronic apparatus according to a third embodiment.

Next, with reference to FIG. 21, an electronic apparatus of the present embodiment will be described by using a projection-type display apparatus as an example. FIG. 21 is a view schematically illustrating a configuration of a projection-type display apparatus as an electronic apparatus according to a third embodiment.

As illustrated in FIG. 21, a projection-type display apparatus 1000 as the electronic apparatus according to the present embodiment includes a lamp unit 1001 as a light source, dichroic mirrors 1011 and 1012 as color light separation means, liquid crystal devices 1B, 1G, and 1R as three light modulating means, three reflection mirrors 1111, 1112, and 1113, three relay lenses 1121, 1122, and 1123, a dichroic prism 1130 as a color light synthetic means, and a projection lens group 1140 as a projection optical system.

The lamp unit 1001 is a light source such as, for example, an ultra-high pressure mercury lamp that emits white light along a system optical axis. The white light emitted from the lamp unit 1001 is separated into red (R), green (G), blue (B) color light by the two dichroic mirrors 1011 and 1012 disposed therein. Specifically, of the white light incident on the dichroic mirror 1011, the red light (R) is transmitted through the dichroic mirror 1011, and the green light (G) and the blue light (B) having a wavelength shorter than that of the red light (R) are reflected. The reflected green light (G) and blue light (B) are incident on the dichroic mirror 1012. Of the green light (G) and the blue light (B) incident on the dichroic mirror 1012, the blue light (B) having a short wavelength is transmitted through the dichroic mirror 1012, and the green light (G) having a long wavelength is reflected. The red light (R) of the separated color light is reflected by the reflection mirror 1111, and is guided to the liquid crystal device 1R corresponding to the color light. The green light (G) reflected by the dichroic mirror 1012 is incident on the liquid crystal device 1G corresponding to the color light. The blue light (B) transmitted through the dichroic mirror 1012 is guided to the liquid crystal device 1B corresponding to the color light via a relay lens system 1120 including the two reflection mirrors 1112 and 1113 and the three relay lenses 1121, 1122, and 1123. Note that the blue light (B) is guided via the relay lens system 1120 in order to prevent a loss of the blue light (B) because an optical path thereof is longer than that of the red light (R) and the green light (G).

In the projection-type display apparatus 1000, the liquid crystal device 1 in the first embodiment described above is applied to the liquid crystal devices 1B, 1G, and 1R as light modulating means. Each of the liquid crystal devices 1B, 1G, and 1R is coupled to an upper circuit in the projection-type display apparatus 1000 via a first extending substrate 41 and a second extending substrate 42. An image signal specifying a gray scale level of a color light component of each of the red light (R), the green light (G), and the blue light (B) is supplied from an external circuit and processed by the upper circuit in the projection-type display apparatus 1000, and the liquid crystal devices 1B, 1G, and 1R are each driven. The light modulated by each of the liquid crystal devices 1B, 1G, and 1R is incident on the dichroic prism 1130 from three directions. Then, in the dichroic prism 1130, the modulated red light (R) and blue light (B) are reflected at 90 degrees, and the modulated green light (g) is transmitted. Therefore, after an image of each color light is synthesized by the dichroic prism 1130, the image is magnified by the projection lens group 1140, and a color image is projected onto a screen 1200.

The liquid crystal device 1 according to the above-described first embodiment is used as the light modulating means, and thus the projection-type display apparatus 1000 in which a display state is previously checked, a failure is less likely to occur, and a stable display state is acquired can be achieved.

Note that the liquid crystal device 2 according to the above-described second embodiment may be used as the light modulating means. Further, the projection-type display apparatus 1000 may be configured to use, as a light source, an LED light source configured to emit light of each color, and the like so as to supply the color light emitted from the LED light source to a different light modulating means.

The electronic apparatus including the liquid crystal device 1 or the liquid crystal device 2 as the electro-optical device to which the present disclosure is applied is not limited to the projection-type display apparatus 1000 in the above-described third embodiment. The present disclosure may be used for an electronic apparatus such as a projection-type head up display (HUD), a direct-view-type head mounted display (HMD), a personal computer, a digital still camera, and a liquid crystal television, for example.

Note that, the present disclosure is not limited to the embodiments described above, and various modifications and improvements can be added to the above-described embodiments. Such modifications will be described below.

Modified Example 1

Figure 22:
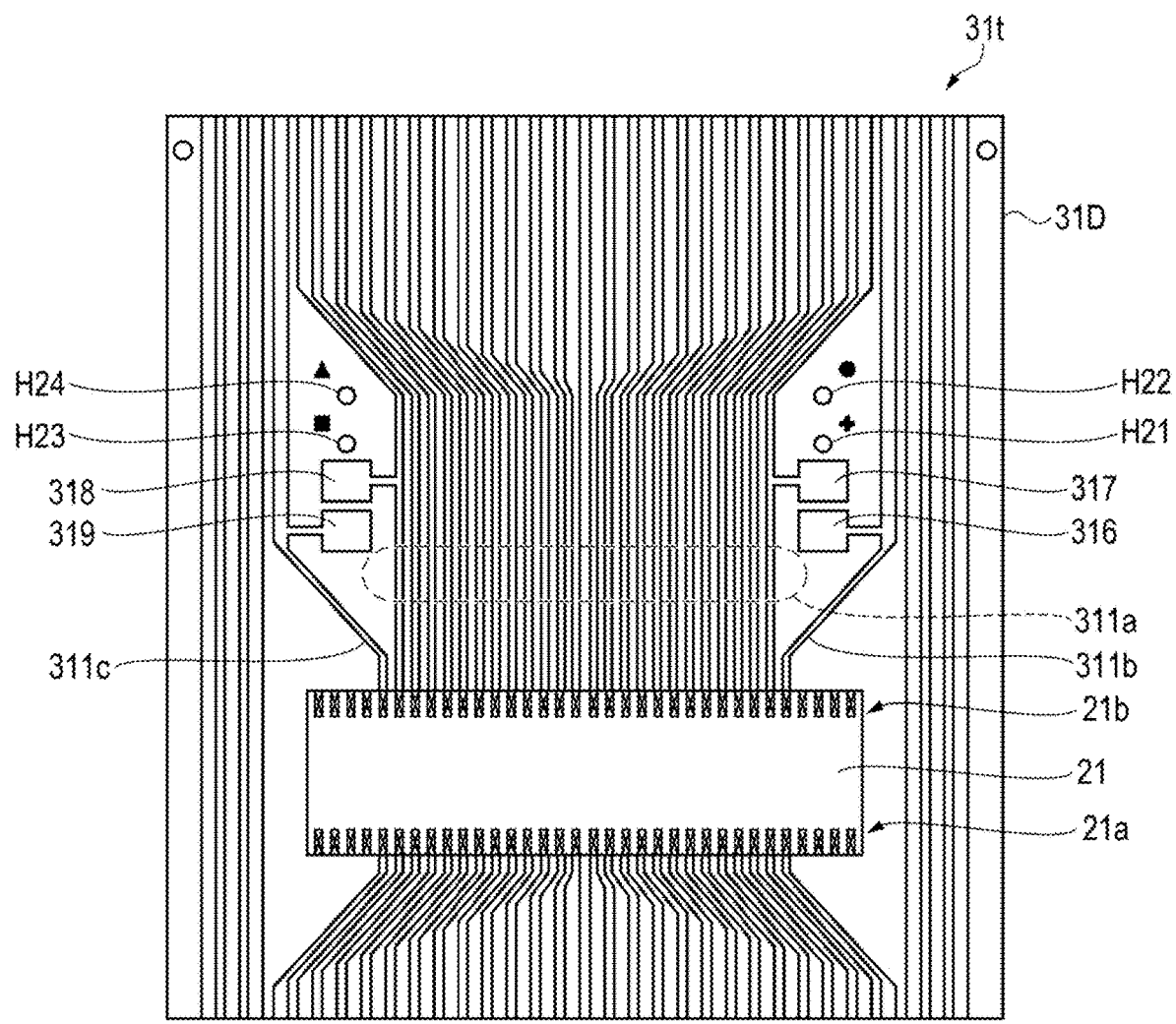
FIG. 22 is a plan view illustrating a configuration of a first flexible wiring substrate according to a modified example.

An identification mark for identifying a signal output from a part of the plurality of output terminals of the second driving IC 22 is not limited to a letter such as "M1 to M4". FIG. 22 is a plan view illustrating a configuration of a first flexible wiring substrate according to a modified example. Specifically, FIG. 22 is a modified example of the first FPC substrate 31C in Working Example 3. As illustrated in FIG. 22, in a first FPC substrate 31D in the modified example, a plus (+) sign is indicated as an identification mark near an opening H21, a circle (○) sign is indicated near an opening H22, a square (□) sign is indicated near an opening H23, and a triangle (▲) sign is indicated near an opening H24. In other words, the identification mark is not limited to a letter, and signs of various shapes and the like can be used. The identification mark may be formed by patterning a wiring layer of the first FPC substrate 31D, or may be printed by using a silk printing technique.

Modified Example 2

Figure 23:
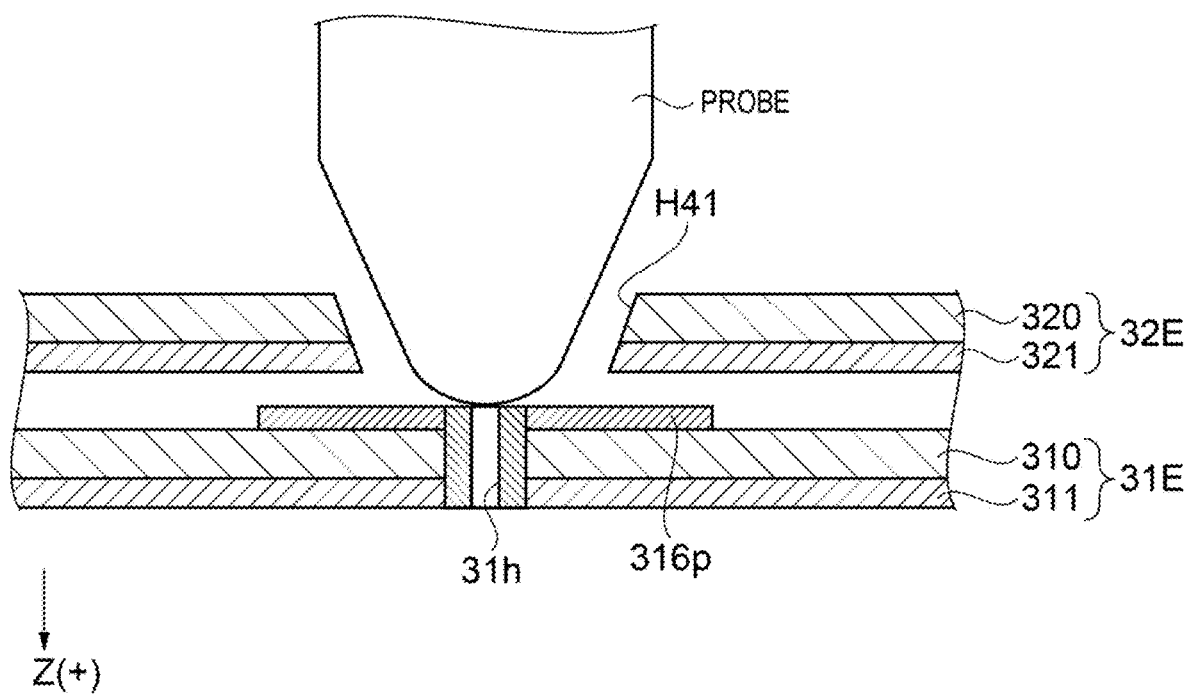
FIG. 23 is a schematic cross-sectional view illustrating a method for detecting a signal from a monitor pad according to the modified example.

In the above-described first embodiment, an opening or a notch portion is provided in the first FPC substrate such that a probe can contact a monitor pad provided at the substrate surface of the second FPC substrate overlapping the first FPC substrate when the FPC substrates are mounted on the terminal portion 105 of the element substrate 101 of the liquid crystal panel 100. However, the present disclosure is not limited to this. FIG. 23 is a schematic cross-sectional view illustrating a method for detecting a signal from a monitor pad according to the modified example. As illustrated in FIG. 23, a first FPC substrate 31E in the modified example includes a base film 310 and a wiring layer 311 provided at one surface of the base film 310. A monitor pad 316p is provided at the other surface of the base film 310. The wiring layer 311 and the monitor pad 316p are electrically coupled to each other via a through hole 31h. In other words, the monitor pad 316p may not necessarily need to be formed in the wiring layer 311. A second FPC substrate 32E overlapping the first FPC substrate 31E in the Z direction includes a base film 320 and a wiring layer 321 provided at one surface of the base film 320. An opening H41 is provided, in the second FPC substrate 32E, in a position overlapping the monitor pad 316p in plan view.

Although not illustrated in FIG. 23, a monitor pad electrically coupled to the wiring layer 321 via the through hole is provided at the other surface of the base film 320 of the second FPC substrate 32E. According to such an aspect of the monitor pad and the opening H41, a probe can contact the monitor pad provided at the first FPC substrate 31E from the second FPC substrate 32E side. In other words, a monitor pad electrically coupled to at least one of the plurality of output terminals of the first driving IC or the second driving IC may be provided at a substrate surface of one of FPC substrates of a substrate surface of the first FPC substrate and a substrate surface of the second FPC substrate that face each other in a state of being mounted on the terminal portion 105 of the element substrate 101, and an opening extending through the other FPC substrate or a notch portion acquired by cutting a part of the other FPC substrate may be provided in a position overlapping the monitor pad. Note that a configuration may be adopted in which a reinforcing pattern by a wiring layer is provided around an opening extending through the FPC substrate or a notch portion in order to suppress a rupture.

Modified Example 3

The electro-optical device to which the present disclosure is applied is not limited to the transmissive liquid crystal device described in the above-described first embodiment or the above-described second embodiment, and may also be applicable to a reflective liquid crystal device. Further, the present disclosure is not limited to a light receiving liquid crystal device, and may also be applicable to a light emitting device including a light emitting element such as an organic EL element in a pixel, for example.

Contents derived from the embodiments will be described below.

An electro-optical device according to the present application includes an electro-optical panel including, from an end portion, a first terminal group and a second terminal group for external coupling that are provided in order, at an interval, in a first direction, a first flexible wiring substrate electrically coupled to the first terminal group, and at which a first driving IC is mounted, and a second flexible wiring substrate that overlaps the first flexible wiring substrate, and is electrically coupled to the second terminal group, and at which a second driving IC is mounted, where a monitor pad electrically coupled to at least one of a plurality of output terminals of the first driving IC or the second driving IC is provided at one of a substrate surface of the first flexible wiring substrate and a substrate surface of the second flexible wiring substrate that face each other, and an opening extending through the other flexible wiring substrate is provided in a position overlapping the monitor pad.

According to the configuration of the present application, the monitor pad provided at the substrate surface of one of the flexible wiring substrates is exposed from the opening provided in the other flexible wiring substrate. Therefore, even when the two flexible wiring substrates overlap each other and are mounted on the electro-optical panel, the electro-optical device that can check a signal output from at least one of the plurality of output terminals of the first driving IC or the second driving IC can be provided by coupling to the monitor pad exposed from the opening.

Another electro-optical device according to the present application includes an electro-optical panel including, from an end portion, a first terminal group and a second terminal group for external coupling that are provided in order, at an interval, in a first direction, a first flexible wiring substrate electrically coupled to the first terminal group, and at which a first driving IC is mounted, and a second flexible wiring substrate that overlaps the first flexible wiring substrate, and is electrically coupled to the second terminal group, and at which a second driving IC is mounted, where a second monitor pad electrically coupled to at least one of a plurality of output terminals of the second driving IC is provided at a substrate surface of the second flexible wiring substrate of a substrate surface of the first flexible wiring substrate and a substrate surface of the second flexible wiring substrate that face each other, and a first opening extending through the first flexible wiring substrate is provided in a position overlapping the second monitor pad, and a first monitor pad electrically coupled to at least one of a plurality of output terminals of the first driving IC is provided between the first opening of the first flexible wiring substrate and the first driving IC.

According to the configuration of the present application, the second monitor pad provided at the substrate surface of the second flexible wiring substrate is exposed from the first opening provided at the first flexible wiring substrate. A signal output from at least one of the plurality of output terminals of the second driving IC can be checked by coupling to the second monitor pad exposed from the first opening. Further, the first monitor pad is provided between the first opening of the first flexible wiring substrate and the first driving IC, and thus a signal output from at least one of the plurality of output terminals of the first driving IC can be checked by coupling to the first monitor pad. Therefore, even when the two flexible wiring substrates overlap each other and are mounted on the electro-optical panel, the electro-optical device that can check a signal output from each of the first driving IC and the second driving IC can be provided by coupling to the first monitor pad and the second monitor pad.

In the electro-optical device described above, a second opening extending through the second flexible wiring substrate may be provided between an end portion on the second terminal group side of the second flexible wiring substrate and the second monitor pad, a distance in the first direction between an end portion on the second terminal group side of the second flexible wiring substrate and the center of the second opening may be identical to a distance in the first direction between an end portion on the first terminal group side of the first flexible wiring substrate and the center of the first opening, and a distance in the first direction between the center of the second opening and the center of the second monitor pad may be identical to a distance in the first direction between the center of the first opening and the center of the first monitor pad.

According to this configuration, the first flexible wiring substrate and the second flexible wiring substrate have the same design, and one flexible wiring substrate can be shared as a component.

In the electro-optical device described above, the first opening may have a length in the first direction longer than a length in a second direction that intersects the first direction.

According to this configuration, in the electro-optical panel, even in a case in which positional precision in the first direction when the first flexible wiring substrate is electrically coupled to the first terminal group and the second flexible wiring substrate is electrically coupled to the second terminal group is lower than positional precision in the second direction, the second monitor pad can be reliably exposed from the first opening.

In the electro-optical device described above, a size of the first opening may be greater than a size of the second monitor pad.

According to this configuration, the second monitor pad can be reliably exposed from the first opening.

In the electro-optical device described above, a size of the first opening may be smaller than a size of the second monitor pad.

According to this configuration, the size of the first opening may be a size that allows electrical coupling to the second monitor pad, and an effect due to the first opening being provided at the first flexible wiring substrate can be reduced on the arrangement of the wiring by reducing the size of the first opening to be smaller than the size of the second monitor pad. In other words, a degree of flexibility in design in the arrangement of the wiring of the first flexible wiring substrate can be improved. Further, the first opening functions as a guide to the second monitor pad, which facilitates probing for detecting a signal from the second monitor pad.

In the electro-optical device described above, a plurality of the second monitor pads may be provided at the second flexible wiring substrate.

According to this configuration, signals of a plurality of kinds output from the plurality of output terminals of the second driving IC can be checked by using the plurality of second monitor pads.

In the electro-optical device described above, at the second flexible wiring substrate, the plurality of second monitor pads may be disposed adjacent to each other in the first direction.

According to this configuration, a degree of flexibility in design of the arrangement of the wiring at the second flexible wiring substrate can be improved as compared to a case in which the plurality of second monitor pads are disposed adjacent to each other in the second direction.

In the electro-optical device described above, at the second flexible wiring substrate, the plurality of second monitor pads may be provided at a predetermined distance in a second direction that intersects the first direction, and the first opening may include two first openings provided at the predetermined distance in the second direction.

According to this configuration, the two first openings can be used for positioning the first flexible wiring substrate with respect to the electro-optical panel.

In the electro-optical apparatus described above, a letter or a sign for identifying a signal output from an output terminal of the second driving IC to which the second monitor pad is electrically coupled may be indicated near the first opening.

According to this configuration, a type of a signal output from the output terminal of the second driving IC can be easily identified, and thus the signal can be reliably checked by using the second monitor pad.

Further, an electro-optical device according to the present application includes an electro-optical panel including, from an end portion, a first terminal group and a second terminal group for external coupling that are provided in order, at an interval, in a first direction, a first flexible wiring substrate electrically coupled to the first terminal group, and at which a first driving IC is mounted, and a second flexible wiring substrate that overlaps the first flexible wiring substrate, and is electrically coupled to the second terminal group, and at which a second driving IC is mounted, where a monitor pad electrically coupled to at least one of a plurality of output terminals of the first driving IC or the second driving IC is provided at one of a substrate surface of the first flexible wiring substrate and a substrate surface of the second flexible wiring substrate that face each other, and a notch portion acquired by cutting a side portion of the other flexible wiring substrate is provided in a position overlapping the monitor pad.

According to the configuration of the present application, the monitor pad provided at the substrate surface of one of the flexible wiring substrates is exposed from the notch portion acquired by cutting the side portion of the other flexible wiring substrate. Therefore, even when the two flexible wiring substrates overlap each other and are mounted on the electro-optical panel, the electro-optical device that can check a signal output from at least one of the plurality of output terminals of the first driving IC or the second driving IC can be provided by coupling to the monitor pad exposed from the notch portion.

Further, another electro-optical device according to the present application includes an electro-optical panel including, from an end portion, a first terminal group and a second terminal group for external coupling that are provided in order, at an interval, in a first direction, a first flexible wiring substrate electrically coupled to the first terminal group, and at which a first driving IC is mounted, and a second flexible wiring substrate that overlaps the first flexible wiring substrate, and is electrically coupled to the second terminal group, and at which a second driving IC is mounted, where a second monitor pad electrically coupled to at least one of a plurality of output terminals of the second driving IC is provided at a substrate surface of the second flexible wiring substrate of a substrate surface of the first flexible wiring substrate and a substrate surface of the second flexible wiring substrate that face each other, and a first notch portion acquired by cutting a side portion of the first flexible wiring substrate is provided in a position overlapping the second monitor pad, and a first monitor pad electrically coupled to at least one of a plurality of output terminals of the first driving IC is provided between the first notch portion of the first flexible wiring substrate and the first driving IC.

According to the configuration of the present application, the second monitor pad provided at the substrate surface of the second flexible wiring substrate is exposed from the first notch portion acquired by cutting the side portion of the first flexible wiring substrate. A signal output from at least one of the plurality of output terminals of the second driving IC can be checked by coupling to the second monitor pad exposed from the first notch portion. Further, the first monitor pad is provided between the first notch portion of the first flexible wiring substrate and the first driving IC, and thus a signal output from at least one of the plurality of output terminals of the first driving IC can be checked by coupling to the first monitor pad. Therefore, even when the two flexible wiring substrates overlap each other and are mounted on the electro-optical panel, the electro-optical device that can check a signal output from each of the first driving IC and the second driving IC can be provided by coupling to the first monitor pad and the second monitor pad.

In the electro-optical device described above, a second notch portion acquired by cutting a side portion of the second flexible wiring substrate may be provided between an end portion on the second terminal group side of the second flexible wiring substrate and the second monitor pad, a distance in the first direction between an end portion on the second terminal group side of the second flexible wiring substrate and an end portion of the second notch portion may be identical to a distance in the first direction between an end portion on the first terminal group side of the first flexible wiring substrate and an end portion of the first notch portion, and a shape of the first notch portion may be identical to a shape of the second notch portion.

According to this configuration, the first flexible wiring substrate and the second flexible wiring substrate have the same design, and one flexible wiring substrate can be shared as a component.

In the electro-optical device described above, a letter or a sign for identifying a signal output from an output terminal of the second driving IC to which the second monitor pad is electrically coupled may be indicated near the first notch portion.

According to this configuration, a type of a signal output from the output terminal of the second driving IC can be easily identified, and thus the signal can be reliably checked by using the second monitor pad.

An electronic apparatus according to the present disclosure includes the electro-optical device described above.

According to the configuration of the present application, the electro-optical apparatus that can check a signal output from the first driving IC or the second driving IC by coupling to the monitor pad is provided. Thus, the electronic apparatus in which a drive state in the electro-optical panel is previously checked, and a failure in mounting the flexible wiring substrate with respect to the electro-optical panel is less likely to occur can be provided.

What is claimed is:

1. An electro-optical device, comprising:
an electro-optical panel including a first terminal group and a second terminal group for external coupling that are provided in order from an end portion of the electro-optical panel to a first direction at an interval;
a first flexible wiring substrate electrically coupled to the first terminal group, and at which a first driving IC is mounted; and
a second flexible wiring substrate that overlaps the first flexible wiring substrate, and is electrically coupled to the second terminal group, and at which a second driving IC is mounted, wherein
one of the first flexible wiring substrate or the second flexible wiring substrate includes a monitor pad electrically coupled to at least one of a plurality of output terminals of the first driving IC or the second driving IC, and the other of the first flexible wiring substrate or the second flexible wiring substrate includes an opening provided in a position overlapping the monitor pad.

2. An electronic apparatus comprising the electro-optical device according to claim 1.

3. An electro-optical device, comprising:
an electro-optical panel including a first terminal group and a second terminal group for external coupling that are provided in order from an end portion of the electro-optical panel to a first direction at an interval;
a first flexible wiring substrate electrically coupled to the first terminal group, and at which a first driving IC is mounted; and
a second flexible wiring substrate that overlaps the first flexible wiring substrate, and is electrically coupled to the second terminal group, and at which a second driving IC is mounted,
wherein the second flexible wiring substrate includes a second monitor pad electrically coupled to at least one of a plurality of output terminals of the second driving IC, and
wherein the first flexible wiring substrate includes a first opening provided in a position overlapping the second monitor pad, and a first monitor pad electrically coupled to at least one of a plurality of output terminals of the first driving IC is provided between the first opening of the first flexible wiring substrate and the first driving IC.

4. The electro-optical device according to claim 3, wherein
a second opening extending through the second flexible wiring substrate is provided between an end portion on the second terminal group side of the second flexible wiring substrate and the second monitor pad,
a distance in the first direction between the end portion on the second terminal group side of the second flexible wiring substrate and a center of the second opening is identical to a distance in the first direction between an end portion on the first terminal group side of the first flexible wiring substrate and a center of the first opening, and
a distance in the first direction between the center of the second opening and a center of the second monitor pad is identical to a distance in the first direction between the center of the first opening and a center of the first monitor pad.

5. The electro-optical device according to claim 3, wherein
the first opening has a length in the first direction longer than a length in a second direction that intersects the first direction.

6. The electro-optical device according to claim 3, wherein
a size of the first opening is greater than a size of the second monitor pad.

7. The electro-optical device according to claim 3, wherein
a size of the first opening is smaller than a size of the second monitor pad.

8. The electro-optical device according to claim 3, wherein
a plurality of the second monitor pads are provided at the second flexible wiring substrate.

9. The electro-optical device according to claim 8, wherein
at the second flexible wiring substrate, the plurality of second monitor pads are disposed adjacent to each other in the first direction.

10. The electro-optical device according to claim 8, wherein
at the second flexible wiring substrate, the plurality of second monitor pads are provided at a predetermined distance in a second direction that intersects the first direction, and
two of the first openings are provided at the predetermined distance in the second direction.

11. The electro-optical device according to claim 3, wherein
a letter or a sign for identifying a signal output from an output terminal of the second driving IC to which the second monitor pad is electrically coupled is indicated near the first opening.

12. An electro-optical device, comprising:
an electro-optical panel including a first terminal group and a second terminal group for external coupling that are provided in order from an end portion of the electro-optical panel to a first direction at an interval;
a first flexible wiring substrate electrically coupled to the first terminal group, and at which a first driving IC is mounted; and
a second flexible wiring substrate that overlaps the first flexible wiring substrate, and is electrically coupled to the second terminal group, and at which a second driving IC is mounted, wherein
one of the first flexible wiring substrate or the second flexible wiring substrate includes a monitor pad electrically coupled to at least one of a plurality of output terminals of the first driving IC or the second driving IC, and the other of the first flexible wiring substrate or the second flexible wiring substrate includes a notch portion is provided in a position overlapping the monitor pad.

13. An electro-optical device, comprising:
an electro-optical panel including a first terminal group and a second terminal group for external coupling that are provided in order from an end portion of the electro-optical panel to a first direction at an interval;

a first flexible wiring substrate electrically coupled to the first terminal group, and at which a first driving IC is mounted; and a second flexible wiring substrate that overlaps the first flexible wiring substrate, and is electrically coupled to the second terminal group, and at which a second driving IC is mounted, wherein the second flexible wiring substrate includes a second monitor pad electrically coupled to at least one of a plurality of output terminals of the second driving IC, and wherein the first flexible wiring substrate includes a first notch portion provided in a position overlapping the second monitor pad, and a first monitor pad electrically coupled to at least one of a plurality of output terminals of the first driving IC is provided between the first notch portion of the first flexible wiring substrate and the first driving IC.

14. The electro-optical device according to claim 13, wherein a second notch portion acquired by cutting a side portion of the second flexible wiring substrate is provided between an end portion on the second terminal group side of the second flexible wiring substrate and the second monitor pad, a distance in the first direction between the end portion on the second terminal group side of the second flexible wiring substrate and an end portion of the second notch portion is identical to a distance in the first direction between an end portion on the first terminal group side of the first flexible wiring substrate and an end portion of the first notch portion, and a shape of the first notch portion is identical to a shape of the second notch portion.

15. The electro-optical device according to claim 13, wherein a letter or a sign for identifying a signal output from an output terminal of the second driving IC to which the second monitor pad is electrically coupled is indicated near the first notch portion.

\* \* \* \* \*